United States Patent
Watanabe et al.

(10) Patent No.: US 12,402,448 B2
(45) Date of Patent: Aug. 26, 2025

(54) METHOD OF PRODUCING REFLECTIVE ELECTRODE FOR DEEP ULTRAVIOLET LIGHT-EMITTING ELEMENT, METHOD OF PRODUCING DEEP ULTRAVIOLET LIGHT-EMITTING ELEMENT, AND DEEP ULTRAVIOLET LIGHT-EMITTING ELEMENT

(71) Applicant: DOWA Electronics Materials Co., Ltd., Tokyo (JP)

(72) Inventors: Yasuhiro Watanabe, Akita (JP); Masayuki Nakano, Akita (JP)

(73) Assignee: DOWA Electronics Materials Co., Ltd., Tokyo (JP)

(*) Notice: Subject to any disclaimer, the term of this patent is extended or adjusted under 35 U.S.C. 154(b) by 717 days.

(21) Appl. No.: 17/424,562

(22) PCT Filed: Jan. 20, 2020

(86) PCT No.: PCT/JP2020/001761
§ 371 (c)(1),
(2) Date: Jul. 21, 2021

(87) PCT Pub. No.: WO2020/153308
PCT Pub. Date: Jul. 30, 2020

(65) Prior Publication Data
US 2022/0123177 A1 Apr. 21, 2022

(30) Foreign Application Priority Data

Jan. 22, 2019 (JP) ................................ 2019-008785
Jan. 17, 2020 (JP) ................................ 2020-006377

(51) Int. Cl.
*H01L 33/40* (2010.01)
*H01L 33/00* (2010.01)
(Continued)

(52) U.S. Cl.
CPC ........ *H01L 33/405* (2013.01); *H01L 33/0075* (2013.01); *H01L 33/04* (2013.01);
(Continued)

(58) Field of Classification Search
CPC ... H01L 33/405; H01L 33/0075; H01L 33/04; H01L 33/145; H01L 33/32; H01L 2933/0016
(Continued)

(56) References Cited

U.S. PATENT DOCUMENTS 8,629,474 B2 * 1/2014 Lee .................... H01L 33/36
257/E33.074
8,787,418 B2 * 7/2014 Shur .................... H01S 5/3216
372/46.015
(Continued)

FOREIGN PATENT DOCUMENTS

CN 101826582 A 9/2010
JP 2000036619 A 2/2000
(Continued)

OTHER PUBLICATIONS

Jeong-Woo Park et al., Low-Resistance and Reflective Ni/Rh and Ni/Au/Rh Contacts to p-GaN for Flip-Chip LEDs, Electrochemical and Solid-State Letters, 2005, pp. G17-G19, vol. 8, No. 1.
(Continued)

Primary Examiner — Eric W Jones
(74) Attorney, Agent, or Firm — KENJA IP LAW PC

(57) ABSTRACT

Provided is a reflective electrode for a deep ultraviolet light-emitting element that enables a balance of both high light emission output and excellent reliability. A method of producing the reflective electrode for a deep ultraviolet light-emitting element includes: a first step of forming Ni with a thickness of 3 nm to 20 nm as a first metal layer on a p-type contact layer having a superlattice structure; a
(Continued)

second step of forming Rh with a thickness of not less than 20 nm and not more than 2 μm as a reflective metal on the first metal layer; and a third step of performing heat treatment of the first metal layer and the second metal layer at not lower than 300° C. and not higher than 600° C.

13 Claims, 4 Drawing Sheets

(51) Int. Cl.
    *H01L 33/04*     (2010.01)
    *H01L 33/14*     (2010.01)
    *H01L 33/32*     (2010.01)

(52) U.S. Cl.
    CPC ............ *H01L 33/145* (2013.01); *H01L 33/32* (2013.01); *H01L 2933/0016* (2013.01)

(58) Field of Classification Search
    USPC .......................................................... 257/79
    See application file for complete search history.

(56) References Cited

U.S. PATENT DOCUMENTS

| | | | | |
|---|---|---|---|---|
| 2002/0167029 A1* | 11/2002 | Koike | ...................... | H01L 33/32 257/201 |
| 2006/0060880 A1* | 3/2006 | Lee | ........................ | H01L 27/15 257/E27.12 |
| 2011/0089401 A1* | 4/2011 | Hiraiwa | ................ | H01L 33/405 257/E33.072 |
| 2012/0098014 A1* | 4/2012 | Muramoto | .............. | H01L 33/22 257/E33.064 |
| 2013/0082237 A1* | 4/2013 | Northrup | ................ | H01L 33/04 257/E33.035 |
| 2013/0119430 A1* | 5/2013 | Lee | ........................ | H01L 33/40 257/99 |
| 2013/0193464 A1* | 8/2013 | Bae | ....................... | H01L 33/405 257/94 |
| 2014/0064314 A1* | 3/2014 | Shur | ..................... | H01S 5/3216 372/45.012 |
| 2015/0144871 A1* | 5/2015 | Miller | .................. | H01S 5/0424 257/13 |
| 2017/0018680 A1* | 1/2017 | Shur | ....................... | H01L 33/38 |
| 2017/0117437 A1 | 4/2017 | Shur et al. | | |
| 2018/0138365 A1* | 5/2018 | Shur | ....................... | H01L 33/06 |
| 2018/0166604 A1* | 6/2018 | Fujita | ................ | H01L 21/02579 |
| 2019/0123239 A1* | 4/2019 | Shatalov | ................. | H01L 33/12 |

FOREIGN PATENT DOCUMENTS

| | | |
|---|---|---|
| JP | 2002280610 A | 9/2002 |
| JP | 2004281553 A | 10/2004 |
| JP | 2012182211 A | 9/2012 |
| JP | 2012248765 A | 12/2012 |
| JP | 2015216352 A | 12/2015 |
| TW | 200807761 A | 2/2008 |
| TW | 201318212 A1 | 5/2013 |
| TW | 201841385 A | 11/2018 |
| WO | 2017017891 A1 | 2/2017 |
| WO | 2018181044 A1 | 10/2018 |

OTHER PUBLICATIONS

Jul. 7, 2020, Notification of Reasons for Refusal issued by the Japan Patent Office in the corresponding Japanese Patent Application No. 2020-006377.

Mar. 24, 2020, International Search Report issued in the International Patent Application No. PCT/JP2020/001761.

Mar. 24, 2020, Notification of Reasons for Refusal issued by the Japan Patent Office in the corresponding Japanese Patent Application No. 2020-006377.

Sep. 17, 2020, Office Action issued by the Taiwan Intellectual Property Office in the corresponding Taiwanese Patent Application No. 109102621.

Takayoshi Takano et al., Deep-ultraviolet light-emitting diodes with external quantum efficiency higher than 20% at 275 nm achieved by improving light-extraction efficiency, Applied Physics Express, 2017, vol. 10, No. 3.

Aug. 29, 2023, Notification of Reasons for Refusal issued by the Japan Patent Office in the corresponding Japanese Patent Application No. 2020-090012.

Jul. 27, 2021, International Preliminary Report on Patentability issued in the International Patent Application No. PCT/JP2020/001761.

Jan. 16, 2024, Notification of Reasons for Refusal issued by the Japan Patent Office in the corresponding Japanese Patent Application No. 2020-090012.

Feb. 18, 2025, Office Action issued by the China National Intellectual Property Administration in the corresponding Chinese Patent Application No. 202080010391.9.

\* cited by examiner

METHOD OF PRODUCING REFLECTIVE ELECTRODE FOR DEEP ULTRAVIOLET LIGHT-EMITTING ELEMENT, METHOD OF PRODUCING DEEP ULTRAVIOLET LIGHT-EMITTING ELEMENT, AND DEEP ULTRAVIOLET LIGHT-EMITTING ELEMENT

TECHNICAL FIELD

The present disclosure relates to a method of producing a reflective electrode for a deep ultraviolet light-emitting element, a method of producing a deep ultraviolet light-emitting element, and a deep ultraviolet light-emitting element, and, in particular, relates to a method of producing a reflective electrode for a deep ultraviolet light-emitting element that enables a balance of both high light emission output and excellent reliability.

BACKGROUND

III-Nitride semiconductors formed of compounds in which N is combined with Al, Ga, In, and/or the like are wide band gap semiconductors having direct transition band structures and are materials for which use in a wide range of fields of application is anticipated, such as for sterilization, water purification, medicine, lighting, and high-density optical recording. In particular, light-emitting elements in which III-nitride semiconductors are used in light-emitting layers can cover from deep ultraviolet light through to the visible light region through adjustment of the proportions in which group III elements are contained, and progress is being made toward the practical use of such light-emitting elements in various light sources.

Light having a wavelength of 200 nm to 350 nm is referred to as deep ultraviolet light. A deep ultraviolet light-emitting element that emits deep ultraviolet light is typically produced as follows. A buffer layer is formed on a substrate such as sapphire or an MN monocrystal and then an n-type semiconductor layer, a light-emitting layer, and a p-type semiconductor layer that are each formed of a III-nitride semiconductor are formed in order. Next, an n-side electrode that electrically connects to the n-type semiconductor layer and a p-side electrode that electrically connects to the p-type semiconductor layer are formed. Conventionally, a p-type GaN contact layer that readily increases the hole concentration has generally been formed at a side of the p-type semiconductor layer where the p-side electrode is located in order to make ohmic contact. Also note that a multiple quantum well (MQW) structure in which barrier layers and well layers that are each formed of a III-nitride semiconductor are stacked alternately is typically adopted in the light-emitting layer.

One characteristic that is required of deep ultraviolet light-emitting elements is a high external quantum efficiency characteristic. The external quantum efficiency is determined by (i) internal quantum efficiency, (ii) electron inflow efficiency, and (iii) light extraction efficiency.

Patent Literature (PTL) 1 discloses a deep ultraviolet light-emitting diode that includes an AlGaN mixed crystal p-type contact layer and a p-side reflective electrode displaying reflectivity with respect to emitted light from a light-emitting layer, and in which a side where a substrate is located is taken to be the light extraction direction. The transmittance of short-wavelength light by a p-type contact layer formed of AlGaN can be increased when there is a higher composition ratio of Al in the p-type contact layer. For this reason, PTL 1 proposes the use of a p-type contact layer formed of AlGaN that has a transmittance in accordance with the wavelength of emitted light instead of a p-type contact layer formed of GaN such as was typically used in the conventional art. PTL 1 also discloses that a metal film having Al as a main component is preferable as a reflective electrode in this situation. Moreover, Ni is used as an insertion metal layer for ohmic contact.

PTL 2 discloses a III-nitride semiconductor light-emitting element in which, in consideration of the low reflectance of metals such as nickel (Ni) and cobalt (Co) with respect to visible light having a wavelength of 380 nm to 550 nm (bluish purple, blue, green), silver (Ag), rhodium (Rh), ruthenium (Ru), platinum (Pt), or palladium (Pd) is used in a positive electrode on a p-type semiconductor layer (for example, a p-type GaN layer), and a first thin film metal layer of 0.2 nm to 20 nm in thickness that is formed of cobalt (Co) or nickel (Ni) is included between the p-type semiconductor layer and the positive electrode on the p-type semiconductor layer.

CITATION LIST

Patent Literature

PTL 1: JP 2015-216352 A
PTL 2: JP 2000-36619 A

SUMMARY

Technical Problem

According to PTL 1, higher transmittance of emitted light by the p-type contact layer is more preferable. This means that, according to PTL 1, a higher Al composition ratio in the p-type contact layer is more preferable.

However, a case in which transmittance with respect to a central emission wavelength of emitted deep ultraviolet light is increased simply by raising the Al composition ratio of a p-type contact layer that contacts with a p-side electrode has been judged to be unsuitable for practical use for the following reason based on experiments conducted by the inventors. Firstly, it is indeed possible to obtain a deep ultraviolet light-emitting element having high light emission output compared to the conventional art by increasing transmittance of deep ultraviolet light in a p-type contact layer. However, when samples of deep ultraviolet light-emitting elements produced in this manner were subjected to an overload reliability test (specifically, passing of 100 mA current for 3 seconds), a phenomenon in which light emission output suddenly fell to a level roughly half of the initial light emission output or in which lighting failure suddenly occurred (hereinafter, referred to as "sudden death") was confirmed in some of the samples.

The inventors also researched a relationship between the type of electrode used in a deep ultraviolet light-emitting diode and the Al composition ratio of a p-type contact layer. When rhodium (Rh), which has comparatively high reflectance in the ultraviolet region despite this reflectance being poorer than that of aluminum (Al), is used as a reflective electrode, use as an electrode is possible in a case in which the electrode is formed on a p-type GaN layer. However, the inventors confirmed that sudden death such as described above occurred and reliability as an electrode was not obtained in a case in which the electrode was formed on a p-type AlGaN layer having an Al content of 30% or higher as a single layer structure.

Elements for which sudden deterioration of light emission output occurs in this manner have inadequate reliability, and the mixing of elements having inadequate reliability into products is not permissible from a viewpoint of quality control of products. Accordingly, one object of the present disclosure is to provide a method of producing a reflective electrode for a deep ultraviolet light-emitting element that enables a balance of both high light emission output and excellent reliability. Another object of the present disclosure is to provide a method of producing a deep ultraviolet light-emitting element in which this reflective electrode is used and a deep ultraviolet light-emitting element obtained thereby.

Solution to Problem

The inventors diligently studied means of solving the problems set forth above. The inventors confirmed experimentally that the problems set forth above can be solved by, in a situation in which rhodium (Rh) having a comparatively high reflectance in the ultraviolet region is used as a metal material of a reflective electrode, providing a metal layer formed of nickel (Ni) between the rhodium and a p-type contact layer having a superlattice structure. In this manner, the inventors completed the present disclosure. Specifically, primary features of the present disclosure are as follows.

(1) A method of producing a reflective electrode for a deep ultraviolet light-emitting element comprising:
a first step of forming Ni with a thickness of 3 nm to 20 nm as a first metal layer on a p-type contact layer having a superlattice structure;
a second step of forming Rh with a thickness of not less than 20 nm and not more than 2 μm as a second metal layer on the first metal layer; and
a third step of performing heat treatment of the first metal layer and the second metal layer at not lower than 300° C. and not higher than 600° C.

(2) The method of producing a reflective electrode for a deep ultraviolet light-emitting element according to the foregoing (1), wherein an atmosphere gas when the heat treatment is performed in the third step contains oxygen.

(3) The method of producing a reflective electrode for a deep ultraviolet light-emitting element according to the foregoing (1) or (2), further comprising: a step of forming a Ni layer as a third metal layer on the second metal layer after the second step; and a step of forming a Rh layer as a fourth metal layer on the third metal layer.

(4) A method of producing a deep ultraviolet light-emitting element comprising:
a step of forming an n-type semiconductor layer on a substrate;
a step of forming a light-emitting layer on the n-type semiconductor layer;
a step of forming a p-type electron blocking layer on the light-emitting layer;
a step of forming a p-type contact layer on the p-type electron blocking layer; and
a step of forming a reflective electrode on the p-type contact layer, wherein
a first step of forming a first layer formed of $Al_xGa_{1-x}N$ having an Al composition ratio x and a second step of forming a second layer formed of $Al_yGa_{1-y}N$ having an Al composition ratio y that is lower than the Al composition ratio x are repeated alternately in the step of forming the p-type contact layer so as to form the p-type contact layer with a superlattice structure, with the Al composition ratio y of the second layer being 0.15 or higher, and
the step of forming the reflective electrode includes:
a first step of forming Ni with a thickness of 3 nm to 20 nm as a first metal layer on an outermost second layer of the p-type contact layer;
a second step of forming Rh with a thickness of not less than 20 nm and not more than 2 μm as a second metal layer on the first metal layer; and
a third step of performing heat treatment of the first metal layer and the second metal layer at 300° C. to 600° C.

(5) The method of producing a deep ultraviolet light-emitting element according to the foregoing (4), wherein
in the superlattice structure of the p-type contact layer, the Al composition ratio x of the first layer is higher than an Al composition ratio $w_0$ of a layer that emits deep ultraviolet light in the light-emitting layer,
the Al composition ratio y of the second layer is lower than the Al composition ratio x, and
equations [1] and [2], shown below, $$0.030 < z - w_0 < 0.20 \quad [1]$$

$$0.050 \leq x - y \leq 0.47 \quad [2]$$

are satisfied by the Al composition ratio $w_0$, the Al composition ratio x, the Al composition ratio y, and a thickness-average Al composition ratio z of the p-type contact layer.

(6) The method of producing a deep ultraviolet light-emitting element according to the foregoing (5), wherein a guide layer having a higher Al composition ratio than Al composition ratios of a barrier layer of the light-emitting layer and the p-type electron blocking layer is further included between the p-type electron blocking layer and a well layer closest to the p-type electron blocking layer in the light-emitting layer.

(7) The method of producing a deep ultraviolet light-emitting element according to the foregoing (6), wherein the guide layer is formed of AlN.

(8) The method of producing a deep ultraviolet light-emitting element according to any one of the foregoing (5) to (7), wherein the Al composition ratio $w_0$ is not lower than 0.25 and not higher than 0.60.

(9) The method of producing a deep ultraviolet light-emitting element according to any one of the foregoing (4) to (8), wherein a total p-type layer thickness of the p-type electron blocking layer and the p-type contact layer is 65 nm to 100 nm.

(10) The method of producing a deep ultraviolet light-emitting element according to any one of the foregoing (4) to (9), further comprising: a step of forming a Ni layer as a third metal layer on the second metal layer after the second step; and a step of forming a Rh layer as a fourth metal layer on the third metal layer.

(11) A deep ultraviolet light-emitting element comprising an n-type semiconductor layer, a light-emitting layer, a p-type electron blocking layer, and a p-type contact layer, in order, on a substrate, wherein
the p-type contact layer has a superlattice structure in which a first layer formed of $Al_xGa_{1-x}N$ having an Al composition ratio x and a second layer formed of $Al_yGa_{1-y}N$ having an Al composition ratio y are stacked alternately, with the Al composition ratio y of the second layer being 0.15 or higher, and the deep ultraviolet light-emitting element further comprises a reflective electrode formed of Ni and Rh on an outermost second layer of the p-type contact layer.

(12) The deep ultraviolet light-emitting element according to the foregoing (11), wherein
in the superlattice structure of the p-type contact layer,
the Al composition ratio x of the first layer is higher than an Al composition ratio $w_0$ of a layer that emits deep ultraviolet light in the light-emitting layer,
the Al composition ratio y of the second layer is lower than the Al composition ratio x, and
equations [1] and [2], shown below, $$0.030 < z - w_0 < 0.20 \quad [1]$$

$$0.050 \leq x - y \leq 0.47 \quad [2]$$

are satisfied by the Al composition ratio $w_0$, the Al composition ratio x, the Al composition ratio y, and a thickness-average Al composition ratio z of the p-type contact layer.

The deep ultraviolet light-emitting element according to the foregoing (11) or (12), wherein a total p-type layer thickness of the p-type electron blocking layer and the p-type contact layer is 65 nm to 100 nm.

Advantageous Effect

According to the present disclosure, it is possible to provide a method of producing a reflective electrode for a deep ultraviolet light-emitting element that enables a balance of both high light emission output and excellent reliability. Moreover, according to the present disclosure, it is possible to provide a method of producing a deep ultraviolet light-emitting element in which this reflective electrode is used and a deep ultraviolet light-emitting element obtained thereby.

BRIEF DESCRIPTION OF THE DRAWINGS

In the accompanying drawings.

DETAILED DESCRIPTION

Figure 1A:
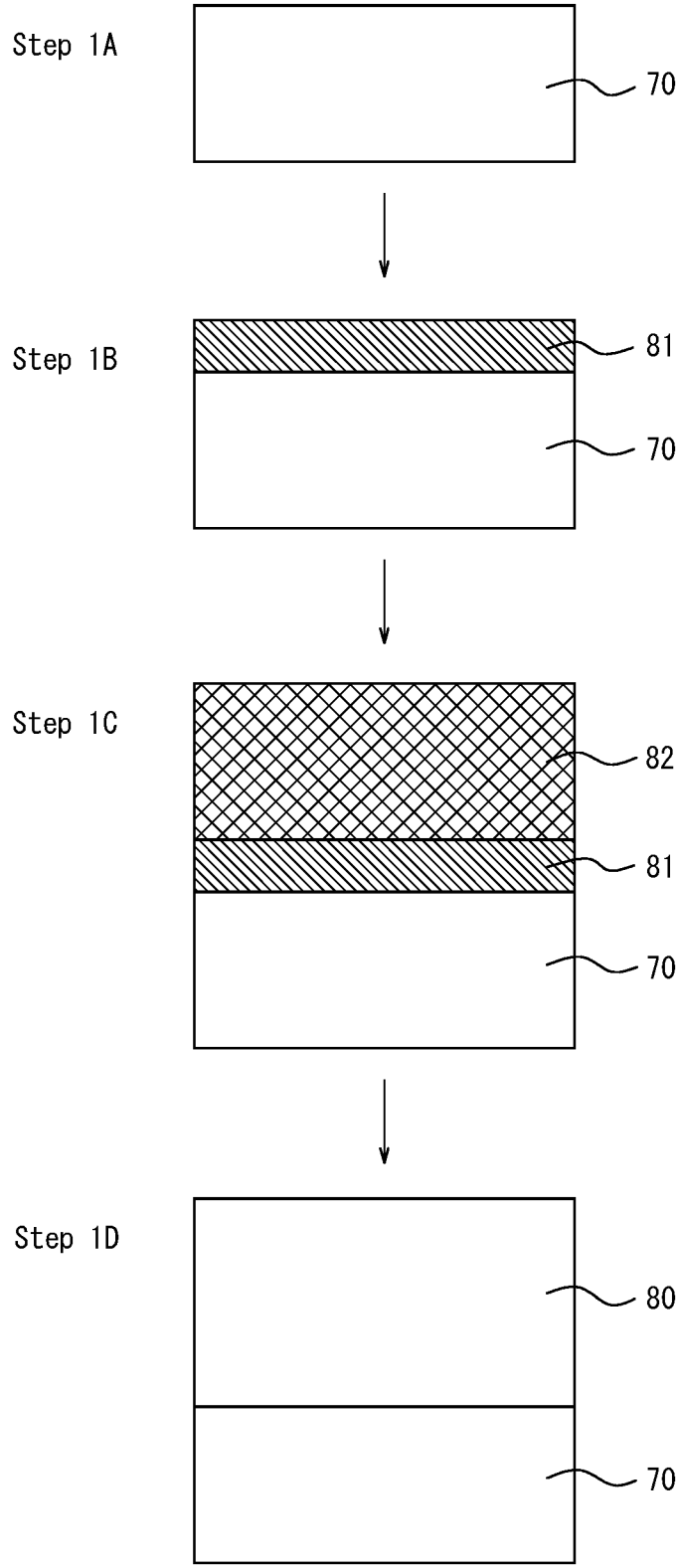
FIG. 1A is a process diagram according to a schematic cross-sectional view for describing a method of producing a reflective electrode for a deep ultraviolet light-emitting element in accordance with one embodiment of the present disclosure.

The following points are described in advance of describing embodiments in accordance with the present disclosure. Firstly, when simply "AlGaN" is written in the present specification without clarifying the composition ratio of Al, this means any compound in which the composition ratio of group III elements (total of Al and Ga) with N is 1:1 and in which the proportions of the group III elements Al and Ga are undefined. Moreover, even when the group III element In is not written, "AlGaN" may contain 5% or less of In relative to the total of Al and Ga as group III elements, and the composition formula written inclusive of In is $Al_{x0}In_{y0}Ga_{1-x0-y0}N$, where the Al composition ratio is taken to be $x_0$ and the In composition ratio is taken to be $y_0$ ($0 \leq y_0 \leq 0.05$). When simply "AlN" or "GaN" is written, this means that Ga or Al is not included, whereas, when simply "AlGaN" is written, this does not exclude the possibility of being AlN or GaN unless clearly stated. Note that the value of the Al composition ratio can be measured through photoluminescence measurement and X-ray diffraction measurement, or the like.

Also, in the present specification, a layer that functions electrically as a p-type is referred to as a p-type layer and a layer that functions electrically as an n-type is referred to as an n-type layer. On the other hand, a layer to which a specific impurity such as Mg or Si is not intentionally added and that does not function electrically as a p-type or an n-type is referred to as an "i-type" or as "undoped". An undoped layer may contain impurities that are unavoidably mixed in during a production process. More specifically, a layer is referred to as "undoped" in the present specification when it has a small carrier density (for example, lower than $4 \times 10^{16}/cm^3$). Values for the impurity concentrations of Mg, Si, and the like are taken to be values according to SIMS analysis.

The overall thickness of layers formed by epitaxial growth can be measured using a spectroscopic film thickness measurement instrument. Moreover, the thickness of each layer can be calculated through cross-section observation of grown layers using a transmission electron microscope in a case in which the compositions of adjacent layers are sufficiently different (for example, a case in which the Al composition ratio differs by at least 0.01). Moreover, in the case of adjacent layers that have different impurity concentrations despite having the same or roughly equal Al composition ratios (for example, less than 0.01 difference), the boundaries and thicknesses thereof are taken to be those measured based on TEM-EDS. Furthermore, the impurity concentrations of both can be measured by SIMS analysis. Also, in the case of thin layers such as in a superlattice structure, the thicknesses of the layers can be measured using TEM-EDS.

The following describes embodiments of the present disclosure with reference to the drawings. Note that constituent elements that are the same are, as a rule, allotted the same reference numbers, and description thereof is omitted. Also note that in the drawings, ratios of the height and width of a substrate and each layer are illustrated in a manner that is exaggerated relative to the actual ratios thereof in order to facilitate description.

(Reflective Electrode)

Figure 2:
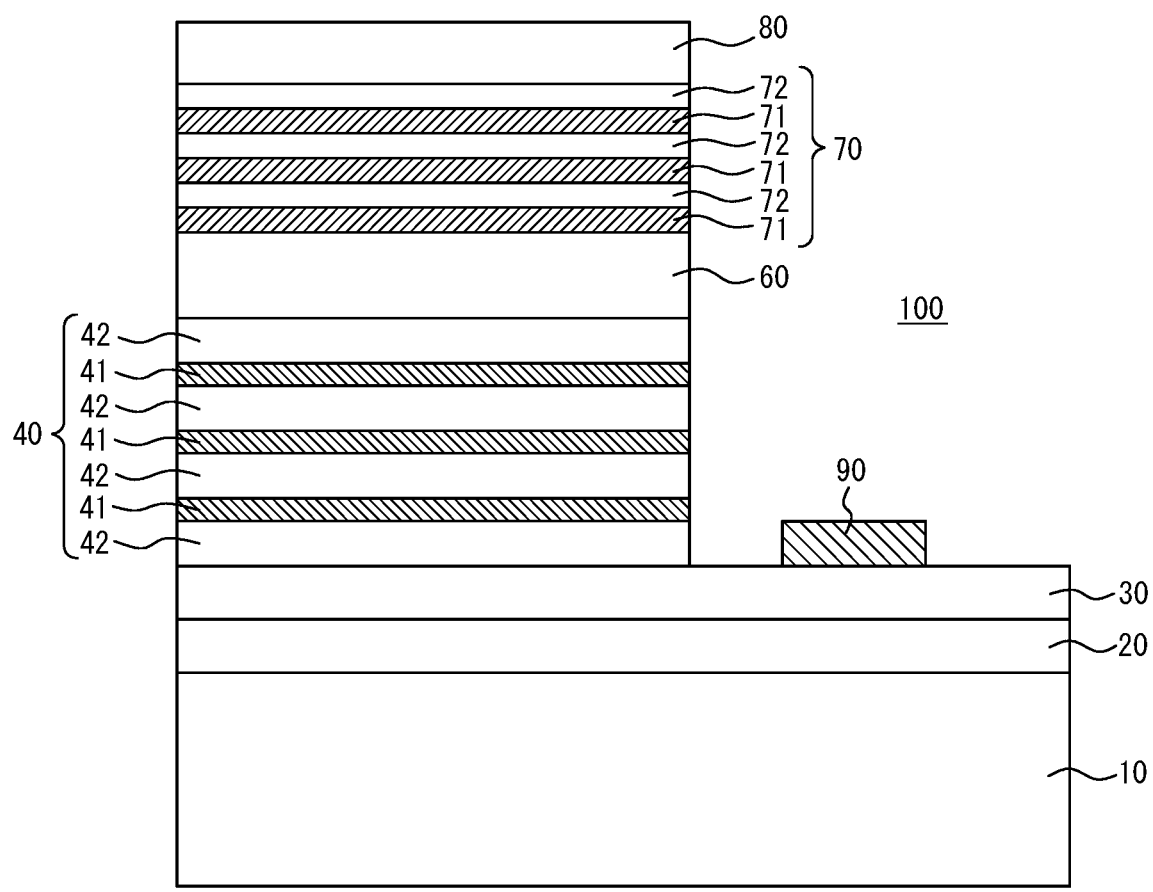
FIG. 2 is a schematic cross-sectional view for describing a deep ultraviolet light-emitting element in accordance with one embodiment of the present disclosure.

FIG. 1A illustrates a p-side reflective electrode 80 obtained by a method of producing a reflective electrode for a deep ultraviolet light-emitting element in accordance with one embodiment of the present disclosure. FIG. 2 is a schematic cross-sectional view of a deep ultraviolet light-emitting element 100 that includes the reflective electrode 80. The following description refers to reference signs in FIG. 1A and FIG. 2. The reflective electrode 80 can be provided directly on a p-type contact layer 70. The reflective electrode 80 is a reflective electrode in which a metal having high reflectance (for example, 60% or higher) with respect to ultraviolet light emitted from a light-emitting layer 40 is used. In the present disclosure, rhodium (Rh) is used as a metal having such reflectance (hereinafter, referred to as a "reflective metal"). Commercially available metal rhodium (for example, 3N purity) can be used as an evaporation source for the rhodium (Rh). The p-type contact layer 70 has a superlattice structure, and a p-side reflective electrode obtained by forming the reflective metal on the p-type contact layer 70 with nickel (Ni) of at least a certain thickness therebetween has high reflectance of deep ultraviolet light. The inventors also found that by performing heat treatment at not lower than 300° C. and not higher than 600° C., comparatively good ohmic contact can be made between the p-type contact layer 70 and the p-side reflective electrode 80, and reliability capable of withstanding even high currents is obtained. Note that since it is extremely difficult to directly measure the reflectance of the reflective electrode 80 while in the deep ultraviolet light-emitting element 100, the reflectance of the reflective electrode 80 is instead taken to be that obtained by forming a first metal layer 81 and a second metal layer 82 on a sapphire substrate and then, both before a heat treatment step and after the heat treatment step, causing light of each wavelength to travel toward the reflective electrode 80 from a side where the transparent sapphire substrate is located, and measuring the reflectance with respect to a wavelength (for example, the reflectance with respect to a wavelength of 300 nm) using an ultraviolet-visible spectrophotometer.

In other words, as can be seen through reference to FIG. 1A, a method of producing a reflective electrode for a deep ultraviolet light-emitting element in accordance with one embodiment of the present disclosure includes: a first step (step 1B in FIG. 1A) of forming Ni with a thickness of 3 nm to 20 nm as a first metal layer 81 on a p-type contact layer 70 (step 1A in FIG. 1A) having a superlattice structure; a second step (step 1C in FIG. 1A) of forming Rh with a thickness of not less than 20 nm and not more than 2 μm as a second metal layer 82 on the first metal layer 81; and a third step (step 1D in FIG. 1A) of performing heat treatment of the first metal layer and the second metal layer at not lower than 300° C. and not higher than 600° C.

First Step

In the first step, Ni is formed with a thickness of 3 nm to 20 nm as a first metal layer 81 on the p-type contact layer 70. The Ni can be vapor deposited on the surface of the p-type contact layer 70 by a typically used technique such as vacuum deposition (electron beam evaporation, resistance heating evaporation, etc.) or sputtering. It is difficult to inhibit sudden death described above when the thickness is less than 3 nm, whereas reflectance of the reflective electrode decreases significantly when the thickness exceeds 20 nm. The thickness of the first metal layer 81 is more preferably set as 3 nm to 10 nm. By forming the first metal layer 81 with a thickness of 10 nm or less, the post-heat treatment reflective electrode 80 can be provided with a reflectance of 60% or higher with respect to a wavelength of 300 nm. Note that the thickness of the first metal layer 81 can be measured using a crystal oscillator film thickness meter.

Second Step

In the second step, Rh is formed with a thickness of not less than 20 nm and not more than 2 μm as a second metal layer 82 on the first metal layer 81. Reflectance of the second metal layer 82 with respect to ultraviolet light is not sufficiently high when the thickness is less than 20 nm. Moreover, the cost of Rh becomes problematic when the thickness exceeds 2 μm. The thickness of the second metal layer 82 is more preferably set as 30 nm or more in order to improve reflectance of the reflective electrode after diffusion of the first metal layer 81 through the subsequently described heat treatment step, and is more preferably set as 100 nm or less in order to limit cost. A typically used technique such as vacuum deposition or sputtering can be used to form the second metal layer in the second step in the same way as in the first step. The thickness of the second metal layer 82 can be measured using a crystal oscillator film thickness meter.

Third Step

In the third step, heat treatment of the first metal layer 81 and the second metal layer 82 is performed at not lower than 300° C. and not higher than 600° C. to obtain the reflective electrode 80. When performing heat treatment in order to make ohmic contact after formation of a p-side electrode as in this step, an inert gas such as nitrogen is typically used as an atmosphere gas. This step may be performed using just an inert gas as an atmosphere gas. However, it is more preferable that oxygen is included in the atmosphere gas in this step. The proportion constituted by oxygen in the atmosphere gas, as a flow ratio, is preferably set as higher than 0% and not higher than 50%.

The reflective electrode 80 obtained in this manner is an electrode that is formed of Ni and Rh. In accompaniment to the heat treatment of the third step, Ni serving as the first metal layer 81 diffuses to a side where Rh of the second metal layer 82 is located from an interface in contact with the p-type contact layer 70. This diffusion of Ni increases the proportion of Rh at the interface between the p-type contact layer 70 and the reflective electrode 80, and thereby increases reflectance at the interface compared to that prior to the heat treatment. Note that because Ni has diffused without maintaining a layer shape in the post-heat treatment reflective electrode 80, it is difficult to accurately measure the amount of Ni after heat treatment (i.e., after diffusion). It is judged that a reflective electrode 80 formed of Ni and Rh has been formed so long as peaks for both Ni and Rh are observed in SEM-EDS analysis of a cross-section (perpendicular cross-section) of the post-heat treatment reflective electrode. In the reflective electrode 80, the volume ratio of Rh (corresponding to an area ratio in mapping of SEM-EDS analysis for a cross-section of the reflective electrode) is 50% or higher, and preferably 75% or higher. Through the volume ratio of Rh in the reflective electrode 80 being 75% or higher, it is possible to provide the post-heat treatment reflective electrode 80 with a reflectance of 60% or higher with respect to a wavelength of 300 nm.

In reflectance measurement of the reflective electrode (after the heat treatment step), since the reflectance of a simple substance of Rh with respect to a wavelength of 300 nm is 70% to 73% and the reflectance of an alloy of Ni and Au is lower than 40%, the reflectance with respect to a wavelength of 300 nm by the reflective electrode 80 formed of Ni and Rh according to the present disclosure can be set within a range of not lower than 40% and lower than 67% by setting the thickness of the first metal layer 81 within a range of 3 nm to 20 nm and the thickness of the second metal layer 82 within a range of 20 nm to 2 μm, and the reflectance with respect to a wavelength of 300 nm can be set as not lower than 60% and lower than 70% by setting the thickness of the first metal layer 81 within a range of 3 nm to 10 nm and the thickness of the second metal layer 82 within a range of 30 nm to 100 nm. Note that the reflectance through a simple substance of Rh is not substantially lowered even when Ni is alloyed with Rh. In the reflective electrode 80, possible impurities other than Ni and Rh that do not significantly lower the reflectance include ruthenium (Ru), gold (Au), platinum (Pt), palladium (Pd), and titanium (Ti), and the content of these impurities is 40 mass % or lower, and preferably 10 mass % or lower.

When the reflective electrode 80 for a deep ultraviolet light-emitting element in accordance with the present embodiment described above is used in a deep ultraviolet light-emitting element, this enables a balance of both high light emission output and excellent reliability.

Figure 1B:
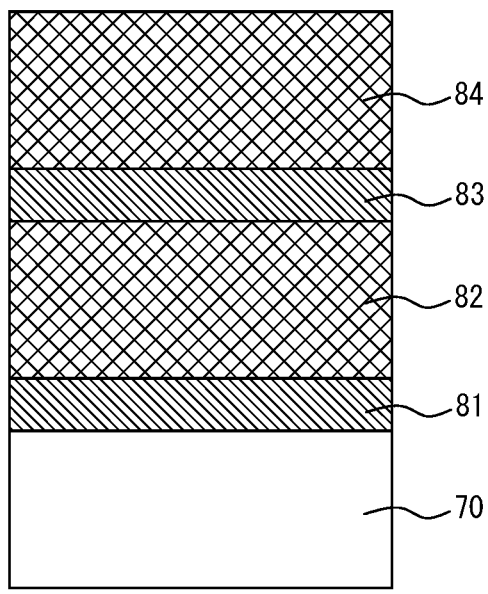
FIG. 1B is a process diagram according to a schematic cross-sectional view for describing a method of producing a reflective electrode for a deep ultraviolet light-emitting element in accordance with another embodiment of the present disclosure.

The following refers to FIG. 1B. In another embodiment to the embodiment set forth above, the further inclusion of a step of forming a Ni layer as a third metal layer 83 on the second metal layer after the second step and a step of forming a Rh layer as a fourth metal layer 84 on the third metal layer 83 is also preferable. Although these steps may be performed between the second step and the third step or may be performed after the third step, it is preferable that these steps are performed straight after the second step, between the second step and the third step, from a perspective of operational efficiency. A Ni layer of 1 nm to 20 nm in thickness can be formed as the third metal layer 83. Moreover, a Rh layer of not less than 5 nm and not more than 2 μm in thickness can be formed as the fourth metal layer 84. Furthermore, it is possible to repeatedly form a Ni layer and a Rh layer corresponding to a third metal layer and a fourth metal layer again on the fourth metal layer 84 such that the reflective electrode is a layered body in which a Ni layer and a Rh layer are repeatedly stacked, in order, a plurality of times.

In a situation in which Au diffuses in the reflective electrode through heating performed in the third step or the like in a state in which Au is present on the second metal layer 82, this may lead to the occurrence of sudden death. However, by setting the reflective electrode formed of Ni and Rh as a layered structure in which a stacking order of Ni and Rh is repeated a plurality of times, the occurrence of sudden death can be inhibited. Consequently, stacking a Ni layer and a Rh layer a plurality of times is preferable because it enables an electrode that can more reliably avoid the occurrence of sudden death regardless of a mounting step in which another metal (gold, etc.) is brought into contact on the Rh layer after stacking so as to form external electrical connection or of the method of external connection (inclusive of a case in which heating is required, such as with solder). From this viewpoint, it is particularly preferable that constituent metal elements of the reflective electrode are only Ni and Rh.

Deep Ultraviolet Light-Emitting Element

The following describes a deep ultraviolet light-emitting element 100 including the reflective electrode 80 that is obtained in accordance with the present disclosure. A deep ultraviolet light-emitting element 100 according to one embodiment of the present disclosure is a deep ultraviolet light-emitting element that includes an n-type semiconductor layer 30, a light-emitting layer 40, a p-type electron blocking layer 60, a p-type contact layer 70, and the p-side reflective electrode 80 described above, in order on a substrate 10, as illustrated in FIG. 2. The reflective electrode 80 is disposed on an outermost second layer 72 of the p-type contact layer. The p-type contact layer 70 has a superlattice structure in which a first layer 71 formed of $Al_xGa_{1-x}N$ having an Al composition ratio x and a second layer 72 formed of $Al_yGa_{1-y}N$ having an Al composition ratio y are stacked alternately. Moreover, the Al composition ratio y of the second layer 72 is 0.15 or higher ($y \leq 0.15$).

In particular, it is preferable that the Al composition ratio x of the first layer 71 is higher than the Al composition ratio $w_0$ of a layer that emits deep ultraviolet light in the light-emitting layer 40, that the Al composition ratio y of the second layer 72 is lower than the Al composition ratio x, and that the Al composition ratio $w_0$, the Al composition ratio x, the Al composition ratio y, and a thickness-average Al composition ratio z of the p-type contact layer 70 satisfy the following equations [1] and [2].

$$0.030 < z - w_0 < 0.20 \quad [1]$$

$$0.050 \leq x - y \leq 0.47 \quad [2]$$

Note that in a preferred form of the deep ultraviolet light-emitting element 100, a buffer layer 20 is provided between the substrate 10 and the n-type semiconductor layer 30, the p-side reflective electrode 80 is disposed directly on the p-type contact layer 70, and an n-side electrode 90 is provided on an exposed surface of the n-type semiconductor layer 30.

The following provides a description for a case in which the Al composition ratio and thickness are constant for each first layer 71 and each second layer 72 in the superlattice structure of the p-type contact layer 70 in order to facilitate description. In this case, the thickness-average Al composition ratio z of the p-type contact layer 70 is defined as follows. First, the number of first layers 71 in the superlattice structure is represented by N and the thickness of each first layer 71 is represented by $t_a$. Likewise, the number of second layers 72 is represented by M and the thickness of each second layer 72 is represented by $t_b$. The thickness-average Al composition ratio z of the p-type contact layer 70 is then in accordance with the following equation [3].

$$z = \frac{N \cdot t_a \cdot x + M \cdot t_b \cdot y}{N \cdot t_a + M \cdot t_b} \quad [3]$$

Note that the Al composition ratio and thickness are not necessarily constant for each first layer 71 and for each second layer 72 in the superlattice structure of the p-type contact layer 70. In a case in which the Al composition ratio and thickness vary for each first layer 71 and for each second layer 72 in the superlattice structure, a weighted average value according to the thickness and the Al composition ratio of each first layer 71 and second layer 72 may be used as the thickness-average Al composition ratio z, and the Al composition ratios x and y of the first layers 71 and the second layers 72 are each a weighted average value according to thickness.

The following firstly describes, in detail, configurations of the substrate 10, the n-type semiconductor layer 30, the light-emitting layer 40, the p-type electron blocking layer 60, and the p-type contact layer 70 of the deep ultraviolet light-emitting element 100 with reference to FIG. 2.

Substrate

A substrate that can transmit light emitted by the light-emitting layer 40 is preferably used as the substrate 10. For example, a sapphire substrate, a monocrystalline AlN substrate, or the like can be used. Moreover, an AlN template substrate obtained through epitaxial growth of an undoped AlN layer at the surface of a sapphire substrate may be used as the substrate 10.

n-Type Semiconductor Layer

The n-type semiconductor layer 30 is disposed on the substrate 10 with a buffer layer 20 interposed therebetween as necessary. The n-type semiconductor layer 30 may be disposed directly on the substrate 10. The n-type semiconductor layer 30 is doped with an n-type dopant. Specific examples of the n-type dopant include silicon (Si), germanium (Ge), tin (Sn), sulfur (S), oxygen (O), titanium (Ti), and zirconium (Zr). The dopant concentration of the n-type dopant is not specifically limited so long as it is a dopant concentration that enables the n-type semiconductor layer 30 to function as an n-type layer and can, for example, be set as $1.0 \times 10^{18}$ atoms/cm$^3$ to $1.0 \times 10^{20}$ atoms/cm$^3$. Moreover, it is preferable that a band gap of the n-type semiconductor layer 30 is wider than a band gap of the light-emitting layer 40 (well layer 41 in the case of a quantum well structure) and that the n-type semiconductor layer 30 displays transmittance with respect to emitted deep ultraviolet light. Besides a single layer structure or a structure formed of a plurality of layers, the n-type semiconductor layer 30 can have a configuration including a superlattice structure or a composition gradient layer in which there is a composition gradient in the crystal growth direction for the composition ratio of a group III element. The n-type semiconductor layer 30 not only forms a contact section with an n-side electrode but also has a function of increasing crystallinity from the substrate up to the light-emitting layer.

Light-Emitting Layer

The light-emitting layer 40 is disposed on the n-type semiconductor layer 30 and emits deep ultraviolet light. The light-emitting layer 40 can be formed of AlGaN, and the Al composition ratio thereof can be set such that the wavelength of emitted light is a wavelength of 200 nm to 350 nm of deep ultraviolet light and the central emission wavelength is not less than 265 nm and not more than 317 nm. An Al composition ratio such as described above can be set within a range of 0.25 to 0.60, for example.

The light-emitting layer 40 may have a single layer structure in which the Al composition ratio is constant, but a configuration in which the light-emitting layer 40 has a multiple quantum well (MQW) structure obtained through repeated formation of a well layer 41 and a barrier layer 42 formed of AlGaN having different Al composition ratios is also preferable. In a case in which the light-emitting layer 40 has a single layer structure in which the Al composition ratio is constant, the Al composition ratio $w_0$ of a layer that emits deep ultraviolet light in the light-emitting layer 40 is the Al composition ratio of the light-emitting layer 40 itself. On the other hand, in a case in which the light-emitting layer 40 has a multiple quantum well structure, an Al composition ratio w of the well layers 41 is treated as corresponding to the Al composition ratio $w_0$ for convenience because the well layers 41 each correspond to a layer that emits deep ultraviolet light in the light-emitting layer 40. Note that the Al composition ratio $w_0$ of the layer that emits deep ultraviolet light (or the Al composition ratio w of the well layers) is preferably set as 0.25 to 0.60 in order that the wavelength of emitted light is a wavelength of 200 nm to 350 nm of deep ultraviolet light and the central emission wavelength is not less than 265 nm and not more than 317 nm.

An Al composition ratio b of the barrier layers 42 is higher than the Al composition ratio w of the well layers 41 (i.e., b>w). The Al composition ratio b of the barrier layers 42 can be set as 0.40 to 0.95, for example, under the condition b>w. The number of repetitions of a well layer 41 and a barrier layer 42 is not specifically limited and can, for example, be set as 1 repetition to 10 repetitions. It is preferable that both extremities of the light-emitting layer 40 in a thickness direction (i.e., a first layer and a final layer) are each a barrier layer. This case is denoted as "n.5 groups of a well layer and a barrier layer", where n is the number of repetitions of a well layer 41 and a barrier layer 42. The thickness of the well layers 41 can be set as 0.5 nm to 5 nm, and the thickness of the barrier layers 42 can be set as 3 nm to 30 nm.

Guide Layer

In a case in which the light-emitting layer 40 has the quantum well structure described above, it is also preferable that a guide layer having a higher Al composition ratio than the Al composition ratios of the barrier layers 42 and the subsequently described p-type electron blocking layer 60 is provided between the p-type electron blocking layer 60 and a well layer 41 that is closest to the p-type electron blocking layer 60 in the light-emitting layer 40. This can increase light emission output of the deep ultraviolet light-emitting element 100. In this case, when the Al composition ratio of the guide layer is denoted $b_g$ and the Al composition ratio α of the subsequently described p-type electron blocking layer 60 is used, a relationship between the Al composition ratios is as shown below.

w (Well layer)<b (Barrier layer)<α(p-Type electron blocking layer)<$b_g$ (Guide layer)

It is also preferable that the light-emitting layer 40 includes n groups of a well layer 41 and a barrier layer 42, starting from a barrier layer 42, that a layer in contact with both the light-emitting layer 40 and the p-type electron blocking layer 60 is set as the guide layer described above, and that the thickness of the guide layer is thin compared to the other barrier layers. For example, it is also preferable that the guide layer is formed of AlN (in this case, referred to specifically as an AlN guide layer) and that the thickness thereof is set as 0.7 nm to 1.7 nm.

p-Type Electron Blocking Layer

The p-type electron blocking layer 60 is disposed on the light-emitting layer 40. The p-type electron blocking layer 60 is used as a layer for blocking electrons, injecting electrons into the light-emitting layer 40 (well layer 41 in the case of a MQW structure), and increasing electron injection efficiency. With this aim, the Al composition ratio α of the p-type electron blocking layer 60 is preferably set as 0.35≤α≤0.95, although this is dependent on the Al composition ratio $w_0$ of the layer that emits deep ultraviolet light (corresponding to the Al composition ratio w of the well layers 41 in the case of a quantum well structure). Note that when the Al composition ratio α is 0.35 or higher, the p-type electron blocking layer 60 may contain In in an amount of 5% or less relative to Al and Ga as group III elements. It is preferable that the Al composition ratio α is set as higher than the thickness-average Al composition ratio z of the p-type contact layer 70 while satisfying the condition set forth above. In other words, it is preferable that α>z. Moreover, with regards to both the Al composition ratio α of the p-type electron blocking layer 60 and the Al composition ratio b of the barrier layers 42, it is more preferable that $0 < \alpha - b \leq 0.55$ is satisfied. By satisfying the above, injection efficiency of electrons to the well layers 41 through the p-type electron blocking layer 60 can reliably be increased.

Although no specific limitations are placed on the thickness of the p-type electron blocking layer 60, the thickness is preferably set as 10 nm to 80 nm, for example. When the thickness of the p-type electron blocking layer 60 is within this range, high light emission output can reliably be obtained. Note that the thickness of the p-type electron blocking layer 60 is preferably thicker than the thickness of the barrier layers 42. Examples of the p-type dopant with which the p-type electron blocking layer 60 is doped include magnesium (Mg), zinc (Zn), calcium (Ca), beryllium (Be), and manganese (Mn), with Mg typically being used. The dopant concentration of the p-type electron blocking layer 60 is not specifically limited so long as it is a dopant concentration that enables the p-type electron blocking layer 60 to function as a p-type layer and can, for example, be set as $1.0 \times 10^{18}$ atoms/cm$^3$ to $5.0 \times 10^{21}$ atoms/cm$^3$.

p-Type Contact Layer

The p-type contact layer 70 is disposed on the p-type electron blocking layer 60. The p-type contact layer 70 is a layer for reducing contact resistance between the p-side reflective electrode 80 disposed directly thereon and the p-type electron blocking layer 60. Accordingly, a configuration other than impurities that are unavoidable in production is not expected to be present between the p-type contact layer 70 and the p-side reflective electrode 80. In other words, the p-side reflective electrode 80 is on and in contact with the p-type contact layer 70 having a superlattice structure.

The p-type contact layer 70 has a superlattice structure in which a first layer 71 formed of $Al_xGa_{1-x}N$ and a second layer 72 formed of $Al_yGa_{1-y}N$ are stacked alternately as previously described. It is preferable that the Al composition ratio x of the first layers 71 is set as higher than the Al composition ratio $w_0$ of the layer that emits deep ultraviolet light in the light-emitting layer 40 ($x > w_0$) so as to increase transmittance of deep ultraviolet light. In a case in which the light-emitting layer 40 has a single layer structure, the Al composition ratio x is preferably set as higher than the Al composition ratio of the light-emitting layer 40, whereas, in a case in which the light-emitting layer 40 has a quantum well structure, the Al composition ratio x is preferably set as higher than the Al composition ratio w of the well layers 41.

As previously described, the Al composition ratio $w_0$, the Al composition ratio x, the Al composition ratio y, and the thickness-average Al composition ratio z of the p-type contact layer preferably satisfy the following equations [1] and [2].

$$0.030 < z - w_0 < 0.20 \quad [1]$$

$$0.050 \leq x - y \leq 0.47 \quad [2]$$

In the conventional art, a p-type GaN layer that readily increases hole concentration has typically been used as a p-type contact layer of a deep ultraviolet light-emitting element. However, a p-type GaN layer absorbs light with a wavelength of 360 nm or less due to the band gap thereof. For this reason, among deep ultraviolet light that is emitted from a light-emitting layer, almost no light extraction from a side where the p-type contact layer is located or light extraction effect due to reflection at a p-side electrode can be expected. On the other hand, when AlGaN having a high Al composition ratio is used as a p-type contact layer, although hole concentration decreases to a certain extent compared to GaN, the light extraction efficiency of a deep ultraviolet light-emitting element as a whole can be increased, and consequently light emission output of the deep ultraviolet light-emitting element can be increased because deep ultraviolet light emitted from a light-emitting layer can pass through the p-type contact layer. However, experiments carried out by the inventors have revealed that a deep ultraviolet light-emitting element having inadequate reliability may be obtained when the Al composition ratio of a p-type contact layer is excessively high. On the other hand, a p-type contact layer 70 having a superlattice structure formed with an Al composition ratio as set forth above is preferable because deep ultraviolet light can pass through the p-type contact layer 70, and consequently higher light emission output is obtained due to the thickness-average Al composition ratio z being higher than the Al composition $w_0$ of the layer that emits deep ultraviolet light in the light-emitting layer 40 ($z > w_0$).

In order to cause more reliable transmission of deep ultraviolet light by the p-type contact layer 70, the difference between the thickness-average Al composition ratio z and the Al composition ratio w of the layer that emits deep ultraviolet light is preferably set as higher than 0.030 (i.e., $z - w_0 > 0.030$) as indicated in the preceding equation [1]. With this aim, the difference between the Al composition ratio z and the Al composition ratio w is more preferably set as higher than 0.040 ($z - w_0 > 0.040$), even more preferably set as higher than 0.050 ($z - w_0 > 0.050$), and particularly preferably set as higher than 0.06 ($z - w_0 > 0.060$).

Moreover, an upper limit for the thickness-average Al composition ratio is preferably set in order to make good ohmic contact between the p-type contact layer 70 and the p-side reflective electrode 80 and obtain adequate reliability. Therefore, the upper limit for the difference between the thickness-average Al composition ratio z and the Al composition ratio w of the layer that emits deep ultraviolet light is preferably set as 0.20 ($z - w_0 < 0.20$) as indicated in the preceding equation [1], and, with this aim, the upper limit for the difference between the Al composition ratio z and the Al composition ratio w is more preferably set as 0.19 ($z - w_0 < 0.19$), and even more preferably set as 0.18 ($z - w_0 < 0.18$).

Furthermore, the difference between the Al composition ratio x of the first layers 71 and the Al composition ratio y of the second layers 72, as an absolute value, is preferably set as 0.050 or higher ($x - y \geq 0.050$) as indicated in the preceding equation [2]. This is in order to ensure that the p-type contact layer 70 functions as a superlattice structure. Moreover, the difference between the Al composition ratio x and the Al composition ratio y, as an absolute value, is preferably set as 0.1 or higher ($x - y \geq 0.10$), and more preferably set as 0.15 or higher ($x - y \geq 0.15$) in order to reduce strain of the overall superlattice structure and cause contact with the p-side reflective electrode 80 at a low Al composition ratio. On the other hand, an excessively large difference between the Al composition ratio x and the Al composition ratio y may increase strain due to there being a large change of lattice constant between the first layers and the second layers and may make it difficult to obtain a superlattice layer having good crystallinity. Therefore, setting x−y≥0.47 is preferable, and setting x−y≥0.45 is more preferable in order to more reliably obtain the disclosed effect.

Note that when the Al composition ratio y of the second layers 72, which are low Al composition ratio layers in the superlattice structure, is set as 0.20 or higher, this is preferable because transmittance of deep ultraviolet light from the light-emitting layer 40 can more reliably be increased. With this aim, the Al composition ratio y is more preferably set as 0.21 or higher, and even more preferably set as 0.25 or higher. On the other hand, when the Al composition ratio y is set as 0.55 or lower, this is preferable because high reliability can be more reliably maintained. With this aim, the Al composition ratio y is more preferably set as 0.51 or lower, and particularly preferably set as 0.40 or lower. Note that so long as the thickness-average Al composition ratio z is higher than the Al composition ratio $w_0$ of the layer that emits deep ultraviolet light in the light-emitting layer 40, the Al composition ratio y may be higher or lower than the Al composition ratio $w_0$. Moreover, the Al composition ratio x may be set as appropriate so long as the previously described equations [1] and [2] are satisfied, and no limitations are placed on the upper limit and the lower limit for the Al composition ratio x. With equations [1] and [2] satisfied, the Al composition ratio x may be set roughly within a range of 0.40 to 0.85.

The thicknesses $t_a$ and $t_b$ of the first layers 71 and the second layers 72, respectively, are not specifically limited so long as a superlattice structure is formed and the condition for the thickness-average Al composition ratio z relative to the Al composition ratio of the light-emitting layer 40 is satisfied. For example, the thickness $t_a$ of the first layers 71 can be set as not less than 1.0 nm and not more than 10.0 nm, and the thickness $t_b$ of the second layers 72 can be set as not less than 1.0 nm and not more than 10.0 nm. No limitations are placed on the relationship between the sizes of the thicknesses $t_a$ and $t_b$. Either of these thicknesses may be larger than the other, or both of these thicknesses may be the same. The number of repetitions of a first layer 71 and a second layer 72 is preferably set as appropriate within a range of 3 repetitions to 15 repetitions, for example, in order that the overall thickness of the p-type contact layer 70 is within a range of not less than 20 nm and not more than 100 nm, and preferably not more than 70 nm.

The total p-type layer thickness, which is the total of the thickness of the p-type electron blocking layer 60 and the thickness of the p-type contact layer 70, is preferably not less than 65 nm and not more than 100 nm, and more preferably not less than 70 nm and not more than 95 nm. High light emission output can more reliably be obtained through the total p-type layer thickness being within any of these ranges.

In the thickness direction of the p-type contact layer 70, a terminal layer that is close to the p-type electron blocking layer 60 is preferably a first layer 71. In other words, in a case in which the p-type contact layer 70 and the p-type electron blocking layer 60 are in contact without another layer interposed therebetween, it is preferable that a first layer 71 is disposed directly on the p-type electron blocking layer 60. Since the Al composition ratio x of the first layers 71 is higher than the Al composition ratio y of the second layers 72, and the Al composition ratio x is closer to the Al composition ratio α of the p-type electron blocking layer 60, the formation of defects due to strain between the p-type electron blocking layer 60 and the p-type contact layer 70 can more reliably be inhibited.

On the other hand, a terminal layer that is far from the p-type electron blocking layer 60 in the thickness direction of the p-type contact layer 70 is preferably a second layer 72. In other words, a layer that is in contact with the p-side reflective electrode 80 is preferably a second layer 72. This is because ohmic contact with the p-side reflective electrode 80 can be made more easily due to the Al composition ratio y of the second layers 72 being low compared to the Al composition ratio x of the first layers 71.

Note that in a case in which, in the thickness direction of the p-type contact layer 70, a terminal layer close to the p-type electron blocking layer 60 is a first layer 71 and a terminal layer far from the p-type electron blocking layer 60 is a second layer 72, the number of first layers 71 and the number of second layers 72 are the same. However, it is not essential that the number of first layers 71 and the number of second layers 72 are the same in the present embodiment. The present embodiment is also inclusive of a case in which both terminal layers in the thickness direction of the p-type contact layer 70 are each a second layer 72 (in this case, the number of second layers 72 is one more than the number of first layers 71).

Although a superlattice structure in which two layers (first layer 71 and second layer 72) are stacked repeatedly is described above as one embodiment in accordance with the present disclosure, a superlattice structure having a three layer structure in which a third layer having an Al composition ratio between those of the first layer and the second layer is disposed between the first layer and the second layer, while keeping the same relationship between the first layer and the second layer as set forth above, can be adopted as another embodiment in accordance with the present disclosure. In this case, the same effect as the disclosed effect described above is obtained.

It is preferable that a high concentration region having a Mg concentration of $3 \times 10^{20}$ atoms/cm$^3$ or higher is included at a side where the p-type contact layer 70 is in contact with the p-side reflective electrode 80, and more preferable that the Mg concentration in the high concentration region is $5 \times 10^{20}$ atoms/cm$^3$ or higher. This can increase the hole concentration of the p-type contact layer 70 and lower the forward voltage Vf of the deep ultraviolet light-emitting element 100. Note that the upper limit for the Mg concentration in the high concentration region can be set as $1 \times 10^{21}$ atoms/cm$^3$ in the present embodiment in consideration of industrial productivity, but this is not intended as a limitation on the upper limit. In this case, the Mg concentration of a region in the p-type contact layer 70 at the side where the p-type electron blocking layer 60 is located can be set within a typical range and is normally not lower than $5 \times 10^{19}$ atoms/cm$^3$ and lower than $3 \times 10^{20}$ atoms/cm$^3$. Note that the Mg concentration in the p-type contact layer is an average concentration for each region according to SIMS measurement. In order to maintain crystallinity of the p-type contact layer 70, the thickness of the high concentration region is normally 15 nm or less, and the high concentration region may be roughly a few layers at the side where the p-type contact layer 70 is in contact with the p-side reflective electrode 80.

Moreover, the inclusion of a Si-doped region having a Si concentration of not lower than $5 \times 10^{16}$ atoms/cm$^3$ and not higher than $1 \times 10^{20}$ atoms/cm$^3$ in the p-type contact layer 70 at the side where the p-type contact layer 70 is in contact with the p-side reflective electrode 80 is also preferable. The Si concentration in this region is more preferably set as not lower than $2 \times 10^{19}$ atoms/cm$^3$ and not higher than $5 \times 10^{19}$ atoms/cm$^3$. This can further increase light emission output of the deep ultraviolet light-emitting element 100. Note that this effect can reliably be obtained when the thickness of the Si-doped region is approximately 1 nm to 5 nm. Setting the Si-doped region as a final second layer in the superlattice structure of the p-type contact layer is also preferable. The high concentration region described above that has a Mg concentration of $3 \times 10^{20}$ atoms/cm$^3$ or higher may be a co-doped region that is further doped with Si. Moreover, the Si-doped region may be doped with just Si (i.e., may not be doped with Mg).

Note that in a case in which a Si-doped region that is doped with just Si is provided at a side of the p-type contact layer 70 that is in contact with the p-side reflective electrode 80 and in which this region is not doped with Mg, the conductivity type of the region can be thought of as an n-type. However, when the thickness is within the range set forth above (1 nm to 5 nm), a thyristor is not formed even when Mg doping is not performed so long as the region is in contact with the p-type electrode as an uppermost layer of the p-type contact layer 70. Accordingly, the Si-doped region is regarded as part of the p-type contact layer 70 even in this case.

The deep ultraviolet light-emitting element 100 in accordance with the present embodiment set forth above can have a balance of both high light emission output and excellent reliability.

Although the following describes specific forms that can be adopted in the deep ultraviolet light-emitting element 100 according to the present embodiment, the present embodiment is not limited to the following forms.

Buffer Layer

Provision of a buffer layer 20 between the substrate 10 and the n-type semiconductor layer 30 as illustrated in FIG. 2 in order to ease lattice mismatch between the substrate 10 and the n-type semiconductor layer 30 is also preferable. The buffer layer 20 can be an undoped III-nitride semiconductor layer, and the adoption of a superlattice structure as the buffer layer 20 is also preferable.

n-Side Electrode

The n-side electrode 90 that can be provided on an exposed surface of the n-type semiconductor layer 30 can be a metal composite film including a Ti-containing film and an Al-containing film formed on the Ti-containing film, for example. The thickness, shape, and size of the n-side electrode 90 can be selected as appropriate in accordance with the shape and size of the light-emitting element. The n-side electrode 90 is not limited to being formed on an exposed surface of the n-type semiconductor layer 30 as illustrated in FIG. 2, but should be electrically connected to the n-type semiconductor layer.

Other Configurations

Although not illustrated in FIG. 2, a guide layer formed of AlGaN having a higher Al composition ratio than the Al composition ratio α of the p-type electron blocking layer 60 may be provided between the light-emitting layer 40 and the p-type electron blocking layer 60. The inclusion of a guide layer can promote injection of holes to the light-emitting layer 40.

p-Type Cladding Layer

Although not illustrated in FIG. 2, a p-type cladding layer formed of AlGaN may be provided between the p-type electron blocking layer 60 and the p-type contact layer 70. The p-type cladding layer is a layer that has an Al composition ratio that is higher than the Al composition ratio of the layer that emits deep ultraviolet light in the light-emitting layer 40 (Al composition ratio w in the case of a quantum well structure) and the thickness-average Al composition ratio z of the p-type contact layer 70, but that is lower than the Al composition ratio α of the p-type electron blocking layer 60. In other words, the p-type electron blocking layer 60 and the p-type cladding layer are each a layer that has a higher Al composition ratio than the Al composition ratio of the layer that emits deep ultraviolet light and are each a layer that substantially transmits deep ultraviolet light emitted from the light-emitting layer 40. However, it is preferable that a p-type cladding layer is not provided. The reason for this is as described in JP 2016-111370 A, the entire disclosure of which is incorporated into the present specification by reference. Note that in a case in which a p-type cladding layer is provided, when the Al composition ratio of the p-type cladding layer is taken to be β, α>β and β>y.

By forming the p-side reflective electrode 80 using a reflective electrode material and causing reflection of deep ultraviolet light in the deep ultraviolet light-emitting element 100 in accordance with the present embodiment, it is possible to set the substrate side or a substrate horizontal direction as a main light extraction direction of the deep ultraviolet light-emitting element 100. Moreover, the deep ultraviolet light-emitting element 100 can have a form that is referred to as a "flip chip-type".

Production Method of Deep Ultraviolet Light-Emitting Element

Figure 3:
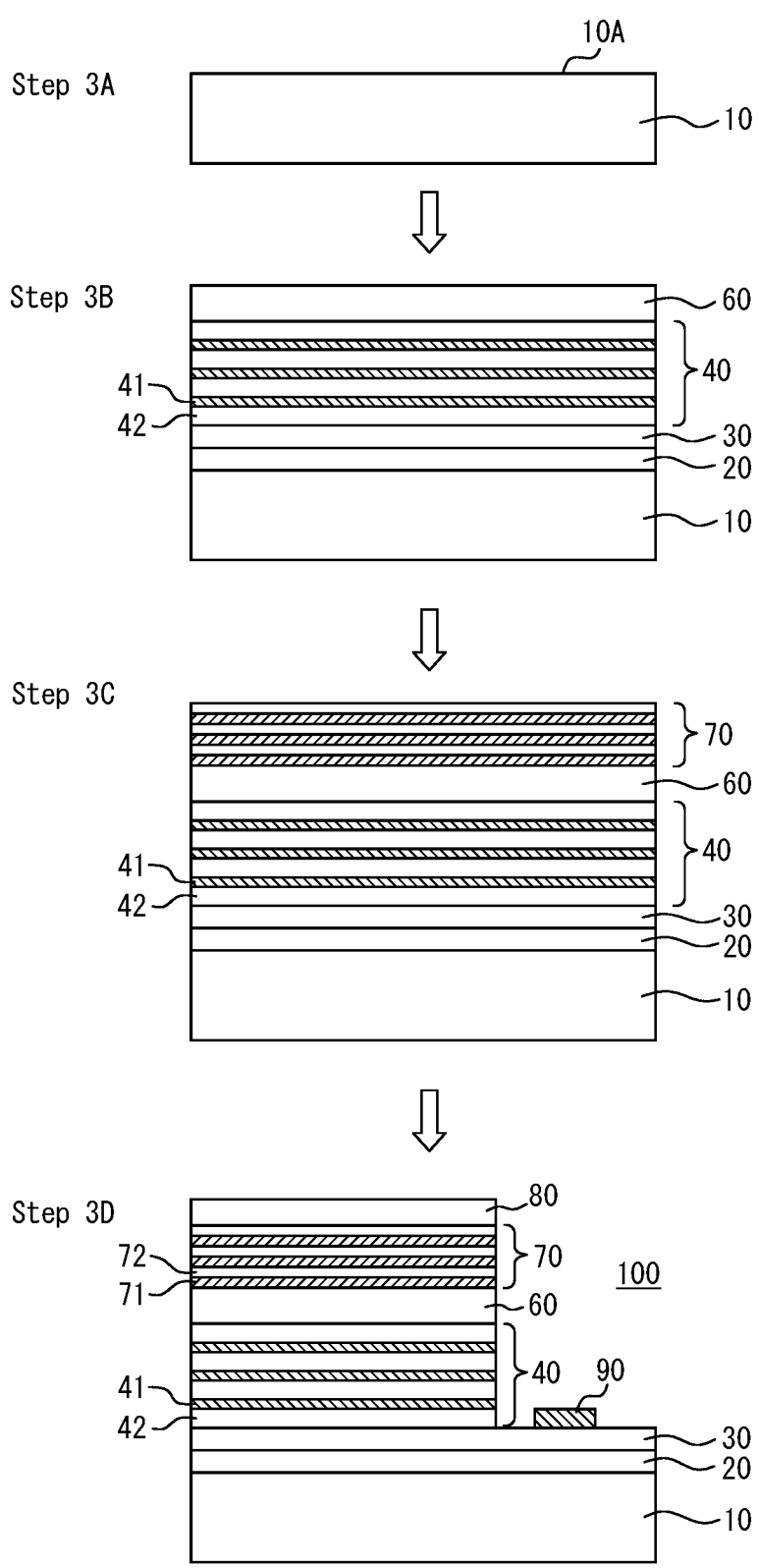
FIG. 3 is a process diagram according to a schematic cross-sectional view for describing a method of producing a deep ultraviolet light-emitting element in accordance with one embodiment of the present disclosure.

Next, one embodiment for obtaining a production method of the deep ultraviolet light-emitting element 100 set forth above is described using FIG. 3. One embodiment of a method of producing the deep ultraviolet light-emitting element 100 in accordance with the present disclosure includes a step of forming an n-type semiconductor layer 30 on a substrate 10 (refer to step 3A in FIG. 3), a step of forming a light-emitting layer 40 on the n-type semiconductor layer 30, a step (refer to step 3B in FIG. 3) of forming a p-type electron blocking layer 60 on the light-emitting layer 40, a step (refer to step 3C in FIG. 3) of forming a p-type contact layer on the p-type electron blocking layer, and a step (refer to step 3D in FIG. 3) of forming a reflective electrode on the p-type contact layer. In the step of forming the p-type contact layer, a first step of forming a first layer formed of $Al_xGa_{1-x}N$ having an Al composition ratio x and a second step of forming a second layer formed of $Al_yGa_{1-y}N$ having an Al composition ratio y that is lower than the Al composition ratio x are repeated alternately to form the p-type contact layer with a superlattice structure, and the Al composition ratio y of the second layers is 0.15 or higher. As described in relation to embodiments of the reflective electrode 80, the step of forming the reflective electrode includes a first step of forming Ni with a thickness of 3 nm to 20 nm as a first metal layer 81 on the p-type contact layer 70 having a superlattice structure, a second step of forming Rh with a thickness of not less than 20 nm and not more than 2 μm as a second metal layer 82 on the first metal layer 81, and a third step of performing heat treatment of the first metal layer and the second metal layer at not lower than 300° C. and not higher than 600° C. (refer to FIG. 1A). Moreover, the step (refer to step 3C) of forming the p-type contact layer 70 is a step in which a first step of forming a first layer 71 formed of $Al_xGa_{1-x}N$ having an Al composition ratio x and a second step of forming a second layer 72 formed of $Al_yGa_{1-y}N$ having an Al composition ratio y that is lower than the Al composition ratio x are repeated alternately to form a p-type contact layer 70 having a superlattice structure, with the Al composition ratio y of the second layers 72 being 0.15 or higher ($y \geq 0.15$).

It is preferable that the Al composition ratio x of the first layers 71 is higher than the Al composition ratio $w_0$ of a layer that emits deep ultraviolet light in the light-emitting layer 40, that the Al composition ratio y of the second layers 72 is lower than the Al composition ratio x, and that the Al composition ratio $w_0$, the Al composition ratio x, the Al composition ratio y, and a thickness-average Al composition ratio z of the p-type contact layer 70 satisfy the following equations [1] and [2].

$$0.030 < z - w_0 < 0.20 \quad [1]$$

$$0.050 \leq x - y \leq 0.47 \quad [2]$$

The following continues description with reference to the flowchart in FIG. 3. However, description that overlaps with previously described embodiments is omitted.

First, an n-type semiconductor layer 30, a light-emitting layer 40, and a p-type electron blocking layer 60 are formed, in order, on a substrate 10 as illustrated in steps 3A and 3B of FIG. 3. In these steps, each layer can be formed by a commonly known epitaxial growth technique such as metal organic chemical vapor deposition (MOCVD), molecular beam epitaxy (MBE), or sputtering.

In formation of each layer among the n-type semiconductor layer 30, the light-emitting layer 40, the guide layer, and the p-type electron blocking layer 60, the growth temperature, growth pressure, and growth time for epitaxial growth can be set as typical conditions in accordance with the Al composition ratio and thickness of each layer. A carrier gas for epitaxial growth may be supplied into the chamber using hydrogen gas, nitrogen gas, a mixed gas of these gases, or the like. In terms of source gases for growth of each layer, TMA (trimethylaluminum), TMG (trimethylgallium), and/or the like can be used as group III element source gases, and $NH_3$ gas can be used as a group V element gas. Typical conditions may also be adopted with regards to the molar ratio of group V element relative to group III element (hereinafter, referred to as the V/III ratio) calculated based on the growth gas flow rates of a group V element gas, such as $NH_3$ gas, and a group III element gas, such as TMA gas. Moreover, in terms of dopant source gases, bis(cyclopentadienyl)magnesium gas ($CP_2Mg$) as a Mg source, or the like, can be selected as appropriate for a p-type dopant and monosilane gas ($SiH_4$) as a Si source, for example, zinc chloride gas ($ZnCl_2$) as a Zn source, or the like can be selected as appropriate for an n-type dopant, and these gases can be supplied into the chamber at specific flow rates.

Next, in the p-type contact layer formation step illustrated in step 3C of FIG. 3, a p-type contact layer 70 having a superlattice structure in which the previously described first layer 71 and second layer 72 are repeated is formed on the p-type electron blocking layer 60. Conditions relating to the thickness range and Al composition ratio of the p-type contact layer 70 are as previously described. The p-type contact layer 70 can be formed through crystal growth by epitaxial growth using MOCVD or the like.

Note that the following treatment may be performed in the p-type contact layer formation step in order to provide a high concentration region 72 having a Mg concentration of $3 \times 10^{20}$ atoms/$cm^3$ or higher in the p-type contact layer 70 at a side where the p-type contact layer 70 is in contact with the p-side reflective electrode 80. Specifically, in the p-type contact layer formation step, a group III source gas, a group V source gas, and a Mg source gas may be supplied so as to cause crystal growth of the previously described superlattice structure, and then, straight after completion of crystal growth, the flow rate of the group III source gas may be reduced to ¼ or less of the flow rate during crystal growth, and supply of the group V source gas and the Mg source gas may be continued for not less than 1 minute and not more than 20 minutes.

Moreover, in order to perform doping of both Mg and Si in the p-type contact layer 70 at the side of the p-type contact layer 70 that is in contact with the p-side reflective electrode 80, monosilane gas ($SiH_4$) or the like as a Si source may be caused to flow into the chamber while also supplying $CP_2Mg$ gas into the chamber as a Mg source. When doping of just Si is to be performed, supply of $CP_2Mg$ gas into the chamber as a Mg source may be stopped, and monosilane gas ($SiH_4$) may be caused to flow as a Si source. Note that in a case in which Si doping is performed at the side of the p-type contact layer 70 that is in contact with the p-side reflective electrode 80, formation of the aforementioned high concentration region of Mg is optional as previously described.

Moreover, the light-emitting layer 40, the p-type electron blocking layer 60, and the p-type contact layer 70 may be partially removed by etching or the like such that an n-side electrode 90 can be formed on the exposed n-type semiconductor layer 30 as illustrated in step 3D of FIG. 3. Note that the n-side electrode 90 can be formed by sputtering, vacuum deposition, or the like. Moreover, formation of a buffer layer 20 on a surface 10A of the substrate 10 is also preferable.

EXAMPLES

The following provides a more detailed description of the present disclosure using examples. However, the present disclosure is not in any way limited by the following examples.

Example 1

A deep ultraviolet light-emitting element according to Example 1 was produced according to the process diagrams illustrated in FIG. 1A and FIG. 3. First, a sapphire substrate (diameter: 2 inches; thickness: 430 μm; face orientation: (0001)) was prepared. Next, an AlN layer having a central film thickness of 0.60 μm was grown on the sapphire substrate by MOCVD to obtain an AlN template substrate. During this growth, the growth temperature of the AlN layer was 1300° C., the growth pressure inside the chamber was 10 Torr, and the growth gas flow rates of ammonia gas and TMA gas were set such that the V/III ratio was 163. Note that the film thickness of the AlN layer was measured by measuring the film thicknesses of 25 locations, in total, dispersed at equal spacing and inclusive of the center of the wafer using a spectroscopic film thickness measurement instrument (Nanospec M6100A produced by Nanometrics).

Next, the AlN template substrate was introduced into a heat treatment furnace, a nitrogen gas atmosphere was provided inside of the furnace, and then the temperature inside the furnace was raised to perform heat treatment of the AlN template substrate. In this heat treatment, the heating temperature was set as 1650° C. and the heating time was set as 4 hours.

Next, a buffer layer of 1 μm in thickness that was formed of undoped $Al_{0.55}Ga_{0.45}N$ was formed by MOCVD. An n-type semiconductor layer of 2 μm in thickness that was formed of $Al_{0.45}Ga_{0.55}N$ and was Si doped was then formed on the buffer layer. Note that the Si concentration of the n-type semiconductor layer, as a result of SIMS analysis, was $1.0 \times 10^{19}$ atoms/cm$^3$.

In addition, three groups of a well layer of 3 nm in thickness that was formed of $Al_{0.29}Ga_{0.71}N$ and a barrier layer of 7 nm in thickness that was formed of $Al_{0.51}Ga_{0.49}N$ were repeatedly stacked in alternation on the n-type semiconductor layer to form a light-emitting layer. The Al composition ratio w of the well layers was 0.29. Next, a guide layer of 1 nm in thickness that was formed of AlN was formed on the light-emitting layer. Note that Si doping was performed during formation of the barrier layers and doping was not performed during formation of the well layers and the guide layer.

A p-type electron blocking layer of 40 nm in thickness that was formed of $Al_{0.58}Ga_{0.42}N$ was subsequently formed on the guide layer using hydrogen gas as a carrier gas. In formation of the p-type electron blocking layer, $CP_2Mg$ gas was supplied into the chamber as a Mg source so as to perform Mg doping. Note that the Mg concentration of the p-type electron blocking layer, as a result of SIMS analysis, was $5.0 \times 10^{18}$ atoms/cm$^3$.

Next, $Al_{0.47}Ga_{0.53}N$ was formed directly on the p-type electron blocking layer as a first layer, $Al_{0.31}Ga_{0.69}N$ was then formed as a second layer, and formation of both of these layers was repeated for 7 groups to form a p-type contact layer having a superlattice structure including 14 layers, in total. Note that the thickness of the first layers was set as 5.0 nm, the thickness of the second layers was set as 2.5 nm, the total thickness of the p-type contact layer was 52.5 nm, and the thickness-average Al composition ratio was set as 0.42. Moreover, in formation of the p-type contact layer, $CP_2Mg$ gas as a Mg source was supplied into the chamber together with TMA gas and TMG gas as group III sources and ammonia gas as a group V source so as to perform crystal growth of a p-type contact layer that was doped with Mg. Thereafter, supply of just the group III source gases was stopped and supply of just the Mg source gas and the group V source gas was continued for 10.5 minutes so as to form a high concentration region at a surface side of the p-type contact layer.

Note that in identification of the Al composition of the p-type contact layer, the Al composition ratio of the p-type contact layer was determined from the light-emission wavelength (band gap energy) of the p-type contact layer as analyzed through photoluminescence measurement.

As a result of SIMS analysis, the Mg concentration of the p-type contact layer at a side where the p-type electron blocking layer was located was $1 \times 10^{20}$ atoms/cm$^3$ and the Mg concentration of the p-type contact layer at a side where a high concentration of Mg was provided (high concentration region), which was a surface side where a p-side reflective electrode 80 was to be formed (i.e., an opposite side to the p-type electron blocking layer), was $3 \times 10^{20}$ atoms/cm$^3$.

The layer structure of Example 1 is shown in Table 1.

TABLE 1

| | Al composition ratio | Dopant | Thickness |
|---|---|---|---|
| p-Type contact layer | 0.31 | Mg | 2.5 nm |
| | 0.47 | | 5.0 nm |
| | 0.31 | | 2.5 nm |
| | 0.47 | | 5.0 nm |
| | 0.31 | | 2.5 nm |
| | 0.47 | | 5.0 nm |
| | 0.31 | | 2.5 nm |
| | 0.47 | | 5.0 nm |
| | 0.31 | | 2.5 nm |
| | 0.47 | | 5.0 nm |
| | 0.31 | | 2.5 nm |
| | 0.47 | | 5.0 nm |
| | 0.31 | | 2.5 nm |
| | 0.47 | | 5.0 nm |
| p-Type electron blocking layer | 0.58 | Mg | 40 nm |
| Guide layer | 1.0 | — | 1 nm |
| Light-emitting layer | 0.29 | — | 3 nm |
| | 0.51 | Si | 7 nm |
| | 0.29 | — | 3 nm |
| | 0.51 | Si | 7 nm |
| | 0.29 | — | 3 nm |
| | 0.51 | Si | 7 nm |
| n-Type semiconductor layer | 0.45 | Si | 2 μm |
| Undoped layer | 0.55 | — | 1 μm |
| AlN layer | 1 | — | 0.6 μm |
| Sapphire substrate | — | — | 430 μm |

A mask was formed on the p-type contact layer and mesa etching was performed by dry etching to expose the n-type semiconductor layer. Next, a Ni layer (first metal layer) of 7 nm in thickness and a Rh layer (second metal layer) of 50 nm in thickness on the Ni layer were formed, in order, on an outermost second layer ($Al_{0.31}Ga_{0.69}N$) of the p-type contact layer by electron beam evaporation. The thicknesses of the Ni layer and the Rh layer were measured using a crystal oscillator film thickness meter (CRTM-9000G produced by Ulvac). The oscillator was gold plated and had a natural frequency of 4.5 MHz to 5.0 MHz. A calibration curve for the crystal oscillator was performed by forming a single film of the target metal with a film thickness of 100 nm or more and measuring the step between where the film was formed and not formed using a Stylus Profilometer (P-6 produced by Tencor).

In addition, an n-side electrode formed of Ti/Al was formed on the exposed n-type semiconductor layer. The Ti thickness was 20 nm and the Al thickness was 150 nm.

Finally, an RTA device (infrared lamp annealing heating system produced by Advance Riko, Inc.) was used to perform heat treatment for ohmic contact through holding at a peak temperature of 550° C. for 10 minutes, and to thereby form a reflective electrode formed of Ni and Rh. The heat treatment atmosphere inside the RTA device was set as a mixed gas of $N_2$ and $O_2$, the flow rate of $N_2$ in the mixed gas was set as 1.0 slm, and the flow rate of $O_2$ in the mixed gas was set as 0.5 slm. The sapphire substrate was divided with a chip size of 1,000 μm×1,000 μm by laser scribing to thereby produce a deep ultraviolet light-emitting element according to Example 1.

Note that when a Ni layer (first metal layer) of 7 nm in thickness and a Rh layer (second metal layer) of 50 nm in thickness were formed on a sapphire substrate, were subjected to the heat treatment step described above, and then reflectance with respect to wavelength was measured using an ultraviolet-visible spectrophotometer (V-650 produced by JASCO Corporation) in a direction toward the reflective electrode from a side where the transparent sapphire substrate was located, the reflectance with respect to a wavelength of 300 nm was 62%.

Example 2

A deep ultraviolet light-emitting element according to Example 2 was produced and evaluated in the same way as in Example 1 with the exception that the heat treatment atmosphere inside the RTA device was set as $N_2$ gas ($N_2$ flow rate: 1.5 slm) instead of the mixed gas atmosphere in Example 1.

Example 3

A deep ultraviolet light-emitting element according to Example 3 was produced and evaluated in the same way as in Example 1 with the exception that the Al composition ratio x of the first layers was set as 0.43 and the Al composition y of the second layers was set as 0.27.

Comparative Example 1

A deep ultraviolet light-emitting element according to Comparative Example 1 was produced and evaluated in the same way as in Example 1 with the exception that the Ni thickness of the reflective electrode in Example 1 was changed to 2 nm.

Note that when a Ni layer (first metal layer) of 2 nm in thickness and a Rh layer (second metal layer) of 50 nm in thickness were formed on a sapphire substrate, were subjected to the heat treatment step described above, and then reflectance with respect to wavelength was measured using an ultraviolet-visible spectrophotometer (V-650 produced by JASCO Corporation) in a direction toward the reflective electrode from a side where the transparent sapphire substrate was located, the reflectance with respect to a wavelength of 300 nm was 67%.

Comparative Example 2

A deep ultraviolet light-emitting element according to Comparative Example 2 was produced and evaluated in the same way as in Example 1 with the exception that Ni of the reflective electrode in Example 1 was not provided.

Comparative Example 3

A deep ultraviolet light-emitting element according to Comparative Example 3 was produced and evaluated in the same way as in Example 1 with the exception that the p-type contact layer (total thickness: 52.5 nm) having a superlattice structure in Example 1 was changed to a single layer structure of an $Al_{0.42}Ga_{0.58}N$ layer having a thickness of 50 nm.

Comparative Example 4

A deep ultraviolet light-emitting element according to Comparative Example 4 was produced and light emission output was evaluated in the same way as in Example 1 with the exception that the reflective electrode formed of Ni and Rh in Example 1 was changed to a reflective electrode obtained by forming, in order, a Ni layer of 10 nm in thickness and a Au layer of 20 nm in thickness on the Ni layer.

Comparative Example 5

The light emission output of a deep ultraviolet light-emitting element according to Comparative Example 5 was evaluated in the same way as in Example 1 with the exception that the reflective electrode formed of Ni and Rh in Example 1 was changed to a reflective electrode obtained by forming, in order, a Ni layer of 10 nm in thickness and a Au layer of 20 nm in thickness on the Ni layer, the Al composition ratio x of the first layers was set as 0.43, and the Al composition ratio y of the second layers was set as 0.27.

Comparative Examples 11 to 13

The p-type contact layer having a superlattice structure in Example 1 was changed to a single layer structure of an AlGaN layer, the Al composition ratio and thickness thereof were set as indicated in Table 3, and Ni was not used in the reflective electrode. Moreover, with the exception that the chip size was set as 560 μm×780 μm, deep ultraviolet light-emitting elements according to Comparative Examples 11 to 13 were produced and evaluated in the same way as in Example 1.

Evaluation 1: Evaluation of Po and Vf

The light-emitting element (chip size: 1,000 μm-square) obtained in each of Examples 1 to 3 and Comparative Examples 1 to 5 was mounted on an AlN submount (size: 20 mm×15 mm; thickness: 0.8 mm) in a flip chip format using spherical Au bumps. In a state with an Al heat sink connected to the AlN submount, a constant current power supply was used to pass a current of 350 mA, during which, the forward voltage was measured and the light emission output was also measured using a photodetector through a light receiving section positioned at the sapphire substrate side. The results are shown in Table 2. Note that upon measurement of the light emission wavelength using a spectrum analyzer, the central emission wavelength was 310 nm in each case.

Each value is an average value for 10 measurement subjects.

Evaluation 2: Evaluation of Reliability (Part 1)

After the measurements of Evaluation 1 had been performed for the examples and Comparative Examples 1 to 5, a current of 350 mA was passed continuously for 160 hours. After this continuous passing of current, the output was remeasured, the remeasured output was compared to the initial output, and sudden death was judged to have occurred in a case in which lighting failure occurred or in which the output suddenly decreased to half or less from the initial light emission output. The proportion of chips for which sudden death occurred among 10 measurement subjects is shown in Table 2.

Evaluation 3: Evaluation of Reliability (Part 2)

For each of Comparative Examples 11 to 13, a mask was formed on the p-type contact layer and then mesa etching was performed by dry etching to expose the n-type semiconductor layer. Thereafter, with respect to the exposed n-type semiconductor layer and the p-type contact layer, the small chip having a size of 560 μm×780 μm was mounted on an MN submount (size: 1.5 mm×1.1 mm; thickness: 0.2 mm) using Au bumps, and the light emission output and forward voltage were measured while passing a current of 20 mA. Each value is an average value for 10 measurement subjects. In addition, with respect to chips taken from 10 locations inside the wafer, the initial light emission output while passing a current of 20 mA was confirmed, and a current of 20 mA was then passed continuously for 250 hours. The proportion of chips for which the light emission output after passing of current decreased to half or less from the initial light emission output (i.e., for which sudden death occurred) is shown in Table 3. Note that measurement of the light emission output was performed using a photodetector positioned at the sapphire substrate surface side.

TABLE 2

| | Production conditions | | | | | RTA heat treatment atmosphere | Evaluation | | |
|---|---|---|---|---|---|---|---|---|---|
| | p-Type contact layer | | | Reflective electrode | | | Light emission output Po [mW] | Forward voltage Vf [V] | Rate of sudden death [%] |
| | First layer Al composition ratio x | Second layer Al composition ratio y | Thickness-average Al composition ratio z | Ni layer | Reflective layer | Presence of oxygen gas | | | |
| Example 1 | 0.47 | 0.31 | 0.42 | 7 nm | Rh: 50 nm | Yes | 123 | 6.1 | 0 |
| Example 2 | 0.47 | 0.31 | 0.42 | 7 nm | Rh: 50 nm | No | 123 | 6.5 | 0 |
| Example 3 | 0.43 | 0.27 | 0.38 | 7 nm | Rh: 50 nm | Yes | 115 | 6.0 | 0 |
| Comparative Example 1 | 0.47 | 0.31 | 0.42 | 2 nm | Rh: 50 nm | Yes | 121 | 7.0 | 20 |
| Comparative Example 2 | 0.47 | 0.31 | 0.42 | None | Rh: 40 nm | Yes | 101 | 7.9 | 100 |
| Comparative Example 3 | 0.42 (single layer) | | 0.42 | 7 nm | Rh: 50 nm | Yes | 120 | 6.1 | 100 |
| Comparative Example 4 | 0.47 | 0.31 | 0.42 | 10 nm | Au: 20 nm | Yes | 80 | 5.9 | 0 |
| Comparative Example 5 | 0.43 | 0.27 | 0.38 | 10 nm | Au: 20 nm | Yes | 79 | 5.7 | 0 |

TABLE 3

| | Production conditions | | | Evaluation | |
|---|---|---|---|---|---|
| | p-Type contact layer | | | | Sudden |
| | Al composition | Thickness [nm] | Electrode | Po [mW] | death [%] |
| Comparative Example 11 | 0.31 | 50 | Rh: 40 nm | 6.6 | 100 |
| Comparative Example 12 | 0.46 | 50 | Rh: 40 nm | 10 | 100 |
| Comparative Example 13 | 0.51 | 50 | Rh: 40 nm | 11 | 100 |

Note that since the thickness of the first layers was 5.0 nm and the thickness of the second layers was 2.5 nm, the thickness-average Al composition ratio z of the p-type contact layer was calculated as: $z=(2/3)x+(1/3)y$. In Examples 1 and 2, $z-w_0=0.42-0.29=0.13$ and $x-y=0.47-0.31=0.16$.

Therefore, the conditions of the following equations [1] and [2] are simultaneously satisfied.

$$0.030 < z - w_0 < 0.20 \quad [1]$$

$$0.050 \leq x - y \leq 0.47 \quad [2]$$

Examination of Evaluation Results

The occurrence of sudden death in Comparative Examples 1 to 3 is thought to be due to the occurrence of a contact fault at the interface of the p-type contact layer and the p-side reflective electrode. In contrast, it is presumed that a contact fault did not occur in Examples 1 to 3 because the p-type contact layer had a superlattice structure and the Ni layer was sufficiently thick. Moreover, it can be seen through comparison of Comparative Examples 4 and 5 with Examples 1 to 3 that a reflective electrode formed of Ni and Rh has an effect of increasing light emission output without significantly changing the forward voltage.

Through the results described above, it was possible to confirm that high light emission output can be obtained while also achieving a balance with reliability by forming a p-side reflective electrode satisfying the disclosed conditions on a p-type contact layer having a superlattice structure.

Example 4

An experiment was performed using deep ultraviolet light-emitting elements for which the central emission wavelength was changed to 280 nm instead of 310 nm as in Examples 1 to 3. A deep ultraviolet light-emitting element according to Example 4 was produced in the same way as in Example 1 with the exception that the Al composition ratios of the semiconductor layers in Example 1 were changed as indicated in the following Table 4. Note that an undoped AlGaN layer was formed on the MN template substrate such as to have a composition gradient with an Al composition ratio of from 0.85 to 0.65 in the crystal growth direction.

TABLE 4

| | Al composition ratio | Dopant | Thickness |
|---|---|---|---|
| p-Type contact layer | 0.35 | Mg | 2.5 nm |
| | 0.71 | | 5.0 nm |
| | 0.35 | | 2.5 nm |
| | 0.71 | | 5.0 nm |
| | 0.35 | | 2.5 nm |
| | 0.71 | | 5.0 nm |
| | 0.35 | | 2.5 nm |
| | 0.71 | | 5.0 nm |
| | 0.35 | | 2.5 nm |
| | 0.71 | | 5.0 nm |
| | 0.35 | | 2.5 nm |
| | 0.71 | | 5.0 nm |
| p-Type electron blocking layer | 0.68 | Mg | 40 nm |
| Guide layer | 1.0 | — | 1 nm |
| Light-emitting layer | 0.45 | — | 3 nm |
| | 0.64 | Si | 7 nm |
| | 0.45 | — | 3 nm |
| | 0.64 | Si | 7 nm |
| | 0.45 | — | 3 nm |
| | 0.64 | Si | 7 nm |

TABLE 4-continued

|  | Al composition ratio | Dopant | Thickness |
|---|---|---|---|
| n-Type semiconductor layer | 0.65 | Si | 2 μm |
| Undoped layer | 0.65<br>\|<br>0.85 | — | 200 nm |
| AlN layer | 1 | — | 0.6 μm |
| Sapphire substrate | — | — | 430 μm |

Comparative Example 6

A deep ultraviolet light-emitting element according to Comparative Example 6 was produced and light emission output was evaluated in the same way as in Example 4 with the exception that the reflective electrode formed of Ni and Rh in Example 4 was changed to a reflective electrode obtained by forming, in order, a Ni layer of 10 nm in thickness and a Au layer of 20 nm in thickness on the Ni layer.

Comparative Example 7

A deep ultraviolet light-emitting element according to Comparative Example 7 was produced and evaluated in the same way as in Example 4 with the exception that the p-type contact layer (total thickness: 52.5 nm) having a superlattice structure in Example 4 was changed to a single layer structure of an $Al_{0.59}Ga_{0.41}N$ layer having a thickness of 50 nm.

Evaluation 4

In Example 4 and Comparative Examples 6 and 7 (each having a chip size of 1,000 μm×1,000 μm in the same way as in Example 1), the light emission output Po and the forward voltage Vf were measured and evaluated in the same way as in Evaluation 1 described above. The results are shown in Table 5. Next, a current of 350 mA was passed continuously for 20 hours after this measurement. The output was remeasured after this continuous passing of current, the remeasured output was compared to the initial output, and sudden death was judged to have occurred in a case in which lighting failure occurred or in which the output suddenly decreased to half or less from the initial light emission output. The proportion of chips for which sudden death occurred among 10 measurement subjects is also shown in Table 5.

In Example 4, $z-w_0=0.59-0.45=0.14$ and $x-y=0.71-0.35=0.36$. Therefore, the conditions of the following equations [1] and [2] are simultaneously satisfied.

$$0.030 < z - w_0 < 0.20 \qquad [1]$$

$$0.050 \le x - y \le 0.47 \qquad [2]$$

Examination of Evaluation Results

The occurrence of sudden death in Comparative Example 7 is thought to be due to the occurrence of a contact fault at the interface of the p-type contact layer and the p-side reflective electrode in the same way as in Comparative Example 3. In contrast, it is presumed that a contact fault did not occur in Example 4 because the p-type contact layer had a superlattice structure and the Ni layer was sufficiently thick. Moreover, it can be seen through comparison of Example 4 with Comparative Example 6 that a reflective electrode formed of Ni and Rh has an effect of increasing light emission output without significantly changing the forward voltage.

Example 5

Each semiconductor layer was formed in the same way as in Example 4, and then electron beam evaporation was used to form, in order, a Ni layer (first metal layer) of 7 nm in thickness and a Rh layer (second metal layer) of 50 nm in thickness on the Ni layer. Next, a Ni layer of 3 nm in thickness was formed as a third metal layer on the Rh layer (second metal layer), and then a Rh layer of 20 nm in thickness was formed as a fourth metal layer, in order. Thereafter, heat treatment was performed for ohmic contact in the same way as in Example 4. Other production conditions were the same as in Example 4. In this manner, a deep ultraviolet light-emitting element according to Example 5 was produced. Note that the total p-type layer thickness of the p-type electron blocking layer and the p-type contact layer was 92.5 nm.

Comparative Example 8

A deep ultraviolet light-emitting element according to Comparative Example 8 was produced in the same way as in Example 5 with the exception that instead of forming a Ni layer of 3 nm in thickness as a third metal layer on the Rh layer (second metal layer) and then forming a Rh layer of 20 nm in thickness as a fourth metal layer as in Example 5, a Au layer of 20 nm in thickness was formed on the Rh layer (second metal layer).

TABLE 5

| | Production conditions | | | | | Evaluation | | |
|---|---|---|---|---|---|---|---|---|
| | p-Type contact layer | | | Reflective electrode | | RTA heat treatment atmosphere | | |
| | First layer Al composition ratio x | Second layer Al composition ratio y | Thickness-average Al composition ratio z | Ni layer | Reflective layer | Presence of oxygen gas | Light emission output Po [mW] | Forward voltage Vf [V] | Rate of sudden death [%] |
| Example 4 | 0.71 | 0.35 | 0.59 | 7 nm | Rh: 50 nm | Yes | 100 | 7.1 | 0 |
| Comparative Example 6 | 0.71 | 0.35 | 0.59 | 10 nm | Au: 20 nm | Yes | 75 | 7.0 | 0 |
| Comparative Example 7 | 0.59 (single layer) | | 0.59 | 7 nm | Rh: 50 nm | Yes | 105 | 8.1 | 100 |

Comparative Example 9

A deep ultraviolet light-emitting element according to Comparative Example 9 was produced in the same way as in Example 5 with the exception that instead of forming a Ni layer of 3 nm in thickness as a third metal layer on the Rh layer (second metal layer) and then forming a Rh layer of 20 nm in thickness as a fourth metal layer as in Example 5, a Ni layer of 3 nm in thickness as a third metal layer and a Au layer of 20 nm in thickness as a fourth metal layer were formed, in order, on the Rh layer (second metal layer).

Evaluation 5

The occurrence or absence of sudden death in the example and comparative examples described above was confirmed in the same way as in Evaluation 4 with the exception that instead of continuously passing current for 20 hours as in Evaluation 4, current was continuously passed for extended times of 168 hours and 1,000 hours. Evaluation results according to Evaluation 5 are shown in Table 6.

TABLE 6

| | Production conditions | | | | | | | | Evaluation | |
|---|---|---|---|---|---|---|---|---|---|---|
| | p-Type contact layer | | | | | | | RTA heat treatment atmosphere | Rate of sudden death [%] | |
| | First layer Al | Second layer Al | Thickness-average Al | | Reflective electrode | | | | | |
| | composition ratio x | composition ratio y | composition ratio z | Ni layer (first layer) | Reflective layer | Third layer | Fourth layer | Presence of oxygen gas | After 168 h | After 1,000 h |
| Example 5 | 0.71 | 0.35 | 0.59 | 7 nm | Rh: 50 nm | Ni: 3 nm | Rh: 20 nm | Yes | 0 | 0 |
| Comparative Example 8 | 0.71 | 0.35 | 0.59 | 7 nm | Rh: 50 nm | Au: 20 nm | — | Yes | 100 | — |
| Comparative Example 9 | 0.71 | 0.35 | 0.59 | 7 nm | Rh: 50 nm | Ni: 3 nm | Au: 20 nm | Yes | 80 | — |

It can be seen from Table 6 that although the occurrence of sudden death is inhibited through a combination of a p-type contact layer having a superlattice structure and a reflective electrode formed of Ni and Rh in accordance with the present disclosure, sudden death may occur in a situation in which Au diffuses inside of the reflective electrode through heating performed in the third step or the like in a state in which Au is present on the Rh layer (second metal layer). It can also be seen that when the reflective electrode of Ni and Rh has a layered structure in which the layer order of Ni and Rh is repeated a plurality of times, the rate of sudden death can be inhibited over a long period.

Example 6

A deep ultraviolet light-emitting element according to Example 6 was produced and evaluated in the same way as in Example 5 with the exception that the thickness of the p-type electron blocking layer was changed from 40 nm to 33 nm. Note that the total p-type layer thickness of the p-type electron blocking layer and the p-type contact layer was 85.5 nm.

Example 7

A deep ultraviolet light-emitting element according to Example 7 was produced and evaluated in the same way as in Example 5 with the exception that the thickness of the first layers of the p-type contact layer was reduced from 5 nm to 2.5 nm and the thickness-average Al composition ratio z was set as 0.53. Note that the total p-type thickness of the p-type electron blocking layer and the p-type contact layer was 75 nm.

The occurrence or absence of sudden death in Examples 6 and 7 was confirmed in the same way as in Evaluation 5. Production conditions and evaluation results for Examples 6 and 7 are shown together with those of the previously described Example 5 and Comparative Example 6 in Table 7 for the purpose of comparison.

TABLE 7

| | Production conditions | | | | | | | Evaluation | | | |
|---|---|---|---|---|---|---|---|---|---|---|---|
| | p-Type electron blocking layer | p-Type contact layer | | | | | | | | | Rate of sudden death [%] |
| | | First layer Al composition ratio x | First layer thickness [nm] | Second layer Al composition ratio y | Second layer thickness [nm] | Thickness-average Al composition ratio z | Total p-type layer thickness [nm] | Reflective electrode | Light emission output Po [mW] | Forward voltage Vf [V] | |
| | thickness [nm] | | | | | | | | | | After 168 h | After 1,000 h |
| Example 5 | 40 | 0.71 | 5.0 | 0.35 | 2.5 | 0.59 | 92.5 | Ni/Rh/Ni/Rh | 79 | 7.5 | 0 | 0 |
| Example 6 | 33 | 0.71 | 5.0 | 0.35 | 2.5 | 0.59 | 85.5 | Ni/Rh/Ni/Rh | 83 | 6.8 | 0 | 0 |
| Example 7 | 40 | 0.71 | 2.5 | 0.35 | 2.5 | 0.53 | 75.0 | Ni/Rh/Ni/Rh | 79 | 7.0 | 0 | 0 |
| Comparative Example 6 | 40 | 0.71 | 5.0 | 0.35 | 2.5 | 0.59 | 92.5 | Ni/Au | 75 | 7.0 | 0 | 40 |

It can be seen from Table 7 that light emission output can be further improved by adjusting the total of the thickness of the p-type electron blocking layer 60 and the thickness of the p-type contact layer 70 (i.e., the total p-type layer thickness). The total p-type layer thickness is preferably not less than 65 nm and not more than 100 nm, and more preferably not less than 70 nm and not more than 95 nm. Moreover, light emission output increased and an electrode having high reliability could be obtained compared to an electrode in which Ni and Au were used.

INDUSTRIAL APPLICABILITY

According to the present disclosure, it is possible to provide a method of producing a reflective electrode for a deep ultraviolet light-emitting element that enables a balance of both high light emission output and excellent reliability. Moreover, according to the present disclosure, it is possible to provide a method of producing a deep ultraviolet light-emitting element in which this reflective electrode is used and a deep ultraviolet light-emitting element obtained thereby.

REFERENCE SIGNS LIST

10 substrate
20 buffer layer
30 n-type semiconductor layer
40 light-emitting layer
41 well layer
42 barrier layer
60 p-type electron blocking layer
70 p-type contact layer
71 first layer
72 second layer
80 reflective electrode
81 first metal layer
82 second metal layer
83 third metal layer
84 fourth metal layer
90 n-side electrode
100 deep ultraviolet light-emitting element

The invention claimed is:

1. A method of producing a reflective electrode for a deep ultraviolet light-emitting element comprising:
   a first step of forming a first metal layer consisting of Ni with a thickness of 3 nm to 20 nm directly on a p-type contact layer having a superlattice structure;
   a second step of forming Rh with a thickness of not less than 20 nm and not more than 2 μm as a second metal layer on the first metal layer; and
   a third step of performing heat treatment of the first metal layer and the second metal layer at not lower than 300° C. and not higher than 600° C.

2. The method of producing a reflective electrode for a deep ultraviolet light-emitting element according to claim 1, wherein an atmosphere gas when the heat treatment is performed in the third step contains oxygen.

3. The method of producing a reflective electrode for a deep ultraviolet light-emitting element according to claim 1, further comprising: a step of forming a Ni layer as a third metal layer on the second metal layer after the second step; and a step of forming a Rh layer as a fourth metal layer on the third metal layer.

4. A method of producing a deep ultraviolet light-emitting element comprising:
   a step of forming an n-type semiconductor layer on a substrate;
   a step of forming a light-emitting layer on the n-type semiconductor layer;
   a step of forming a p-type electron blocking layer on the light-emitting layer;
   a step of forming a p-type contact layer on the p-type electron blocking layer; and
   a step of forming a reflective electrode on the p-type contact layer, wherein
   a first step of forming a first layer formed of $Al_xGa_{1-x}N$ having an Al composition ratio x and a second step of forming a second layer formed of $Al_yGa_{1-y}N$ having an Al composition ratio y that is lower than the Al composition ratio x are repeated alternately in the step of forming the p-type contact layer so as to form the p-type contact layer with a superlattice structure, with the Al composition ratio y of the second layer being 0.15 or higher, and
   the step of forming the reflective electrode includes:
   a first step of forming a first metal layer consisting of Ni with a thickness of 3 nm to 20 nm directly on an outermost second layer of the p-type contact layer;
   a second step of forming Rh with a thickness of not less than 20 nm and not more than 2 μm as a second metal layer on the first metal layer; and
   a third step of performing heat treatment of the first metal layer and the second metal layer at 300° C. to 600° C.

5. The method of producing a deep ultraviolet light-emitting element according to claim 4, wherein
in the superlattice structure of the p-type contact layer,
the Al composition ratio x of the first layer is higher than an Al composition ratio $w_0$ of a layer that emits deep ultraviolet light in the light-emitting layer,
the Al composition ratio y of the second layer is lower than the Al composition ratio x, and
equations [1] and [2], shown below, $$0.030 < z - w_0 < 0.20 \quad [1]$$

$$0.050 \leq x - y \leq 0.47 \quad [2]$$

are satisfied by the Al composition ratio $w_0$, the Al composition ratio x, the Al composition ratio y, and a thickness-average Al composition ratio z of the p-type contact layer.

6. The method of producing a deep ultraviolet light-emitting element according to claim 5, wherein a guide layer having a higher Al composition ratio than Al composition ratios of a barrier layer of the light-emitting layer and the p-type electron blocking layer is further included between the p-type electron blocking layer and a well layer closest to the p-type electron blocking layer in the light-emitting layer.

7. The method of producing a deep ultraviolet light-emitting element according to claim 6, wherein the guide layer is formed of AlN.

8. The method of producing a deep ultraviolet light-emitting element according to claim 5, wherein the Al composition ratio wo is not lower than 0.25 and not higher than 0.60.

9. The method of producing a deep ultraviolet light-emitting element according to claim 4, wherein a total p-type layer thickness of the p-type electron blocking layer and the p-type contact layer is 65 nm to 100 nm.

10. The method of producing a deep ultraviolet light-emitting element according to claim 4, further comprising: a step of forming a Ni layer as a third metal layer on the second metal layer after the second step; and a step of forming a Rh layer as a fourth metal layer on the third metal layer.

11. A deep ultraviolet light-emitting element comprising an n-type semiconductor layer, a light-emitting layer, a p-type electron blocking layer, and a p-type contact layer, in order, on a substrate, wherein
the p-type contact layer has a superlattice structure in which a first layer formed of $Al_xGa_{1-x}N$ having an Al composition ratio x and a second layer formed of $Al_yGa_{1-y}N$ having an Al composition ratio y are stacked alternately, with the Al composition ratio y of the second layer being 0.15 or higher,
the deep ultraviolet light-emitting element further comprises a reflective electrode consisting of Ni and Rh directly on an outermost second layer of the p-type contact layer,
a guide layer having a higher Al composition ratio than Al composition ratios of a barrier layer of the light-emitting layer and the p-type electron blocking layer is further included between the p-type electron blocking layer and a well layer closest to the p-type electron blocking layer in the light-emitting layer,
the guide layer has a thickness of 0.7 nm to 1.7 nm, and
a volume ratio of Rh in the reflective electrode is 75% or higher.

12. The deep ultraviolet light-emitting element according to claim 11, wherein
in the superlattice structure of the p-type contact layer,
the Al composition ratio x of the first layer is higher than an Al composition ratio $w_0$ of a layer that emits deep ultraviolet light in the light-emitting layer,
the Al composition ratio y of the second layer is lower than the Al composition ratio x, and
equations [1] and [2], shown below, $$0.030 < z - w_0 < 0.20 \quad [1]$$

$$0.050 \leq x - y \leq 0.47 \quad [2]$$

are satisfied by the Al composition ratio $w_0$, the Al composition ratio x, the Al composition ratio y, and a thickness-average Al composition ratio z of the p-type contact layer.

13. The deep ultraviolet light-emitting element according to claim 11, wherein a total p-type layer thickness of the p-type electron blocking layer and the p-type contact layer is 65 nm to 100 nm.

* * * * *